(12) United States Patent
Fishburn

(10) Patent No.: US 10,707,210 B2
(45) Date of Patent: Jul. 7, 2020

(54) DEVICES HAVING A TRANSISTOR AND A CAPACITOR ALONG A COMMON HORIZONTAL LEVEL, AND METHODS OF FORMING DEVICES

(71) Applicant: Micron Technology, Inc., Boise, ID (US)

(72) Inventor: Fredrick D. Fishburn, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 16/150,714

(22) Filed: Oct. 3, 2018

(65) Prior Publication Data

US 2019/0181142 A1 Jun. 13, 2019

Related U.S. Application Data

(63) Continuation of application No. 62/595,912, filed on Dec. 7, 2017.

(51) Int. Cl.
*H01L 27/108* (2006.01)

(52) U.S. Cl.
CPC .... *H01L 27/10805* (2013.01); *H01L 27/1085* (2013.01); *H01L 27/10873* (2013.01); *H01L 27/10885* (2013.01); *H01L 27/10888* (2013.01); *H01L 27/10891* (2013.01); *G11C 2211/561* (2013.01)

(58) Field of Classification Search
CPC ............... H01L 27/10847; H01L 29/68; G11C 2211/561
See application file for complete search history.

(56) References Cited

U.S. PATENT DOCUMENTS

| 7,372,093 | B2 | 5/2008 | Sommer et al. | |
|---|---|---|---|---|
| 8,609,523 | B2 | 12/2013 | Forbes | |
| 9,177,872 | B2 | 11/2015 | Sandhu | |
| 2003/0161201 | A1 | 8/2003 | Sommer et al. | |
| 2008/0093644 | A1 | 4/2008 | Forbes | |
| 2012/0161132 | A1* | 6/2012 | Yamazaki | ........... H01L 27/1225 257/57 |

FOREIGN PATENT DOCUMENTS

WO WO 3/2019
PCT/US2018/054296

* cited by examiner

*Primary Examiner* — Cheung Lee
(74) *Attorney, Agent, or Firm* — Wells St. John P.S.

(57) ABSTRACT

Some embodiments include an assembly having a stack of first and second alternating levels. The first levels are insulative levels. The second levels are device levels having integrated devices. Each of the integrated devices has a transistor coupled with an associated capacitor, and the capacitor is horizontally offset from the transistor. The transistors have semiconductor channel material, and have transistor gates along the semiconductor channel material. Each of the transistors has a first source/drain region along one side of the semiconductor channel material and coupled with the associated capacitor, and has a second source/drain region. Wordlines extend horizontally along the device levels and are coupled with the transistor gates. Digit lines extend vertically through the device levels and are coupled with the second source/drain regions. Some embodiments include methods of forming integrated structures.

20 Claims, 38 Drawing Sheets

US 10,707,210 B2

DEVICES HAVING A TRANSISTOR AND A CAPACITOR ALONG A COMMON HORIZONTAL LEVEL, AND METHODS OF FORMING DEVICES

RELATED PATENT DATA

This patent is related to U.S. Provisional Application Ser. No. 62/595,912, which was filed Dec. 7, 2017.

TECHNICAL FIELD

Devices which have a transistor and a capacitor; and in which the transistor and the capacitor are along a common horizontal level. Methods of forming devices in which a transistor and an associated capacitor of a memory cell are both along the same horizontal level as one another.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory is dynamic random access memory (DRAM). The DRAM unit cells may each comprise a capacitor in combination with a transistor. Charge stored on the capacitors of the DRAM unit cells may correspond to memory bits.

There is a continuing goal to improve architectural layouts of integrated circuit structures in an effort to maintain (or even improve) device performance, while achieving ever higher levels of integration. It is desired to develop improved architectures, and improved devices. It would be desirable for the improved devices to be suitable for utilization in memory and/or in other integrated circuitry. It is further desired to develop methods for fabricating the improved devices and architectures.

BRIEF DESCRIPTION OF THE DRAWINGS

FIGS. 10A-23A are diagrammatic top-down sectional views of the regions of the example assembly at the example process stages of FIGS. 10-23. The views of FIGS. 10-23 are along the lines X-X of FIGS. 10A-23A, and the views of FIGS. 10A-23A are along the lines Z-Z of FIGS. 10-23.

DETAILED DESCRIPTION OF THE ILLUSTRATED EMBODIMENTS

Some embodiments include integrated devices having capacitors and transistors, with the capacitors being horizontally offset from the transistors. The integrated devices may be vertically stacked one atop another in an integrated assembly. In some embodiments, the integrated devices may be memory cells of a DRAM array. Some embodiments include methods of forming integrated devices which have capacitors horizontally offset from transistors, and some embodiments include methods of forming architectures which comprise vertically-stacked tiers of such integrated devices. Example embodiments are described with reference to FIGS. 1-23.

Figure 1:
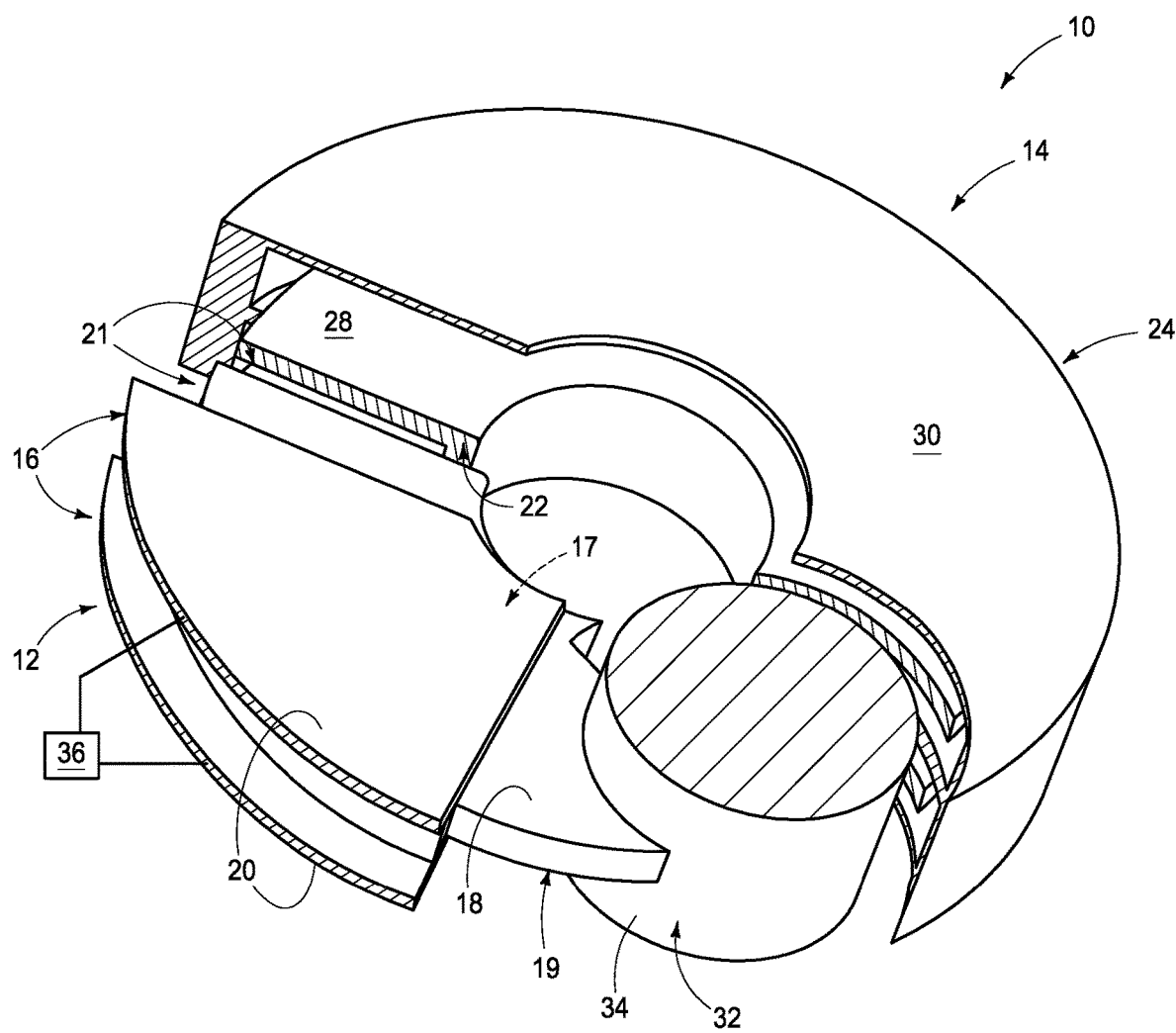
FIG. 1 is a diagrammatic three-dimensional view of an example device.

Referring to FIG. 1, a device 10 is illustrated to comprise a transistor 12 and a capacitor 14.

The transistor 12 includes a gate 16, and a semiconductor material 18 adjacent the gate. The semiconductor material 18 includes a channel region 17. The channel region 17 is not visible in FIG. 1, as it is under a portion of the gate 16; but an approximate location of the channel region is diagrammatically illustrated with a dashed arrow. The semiconductor material 18 also includes a first source/drain region 19 on one side of the channel region 17, and a second source/drain region 21 on an opposing side of the channel region from the first source/drain region 19.

The transistor gate 16 comprises conductive material 20. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The semiconductor material 18 may comprise any suitable composition or combination of compositions; such as, for example, one or more of silicon, germanium, III/V materials (e.g., gallium phosphide), semiconductor oxides, etc. The source/drain regions 19 and 21 may comprise conductively-doped regions. The channel region 17 may be doped to an appropriate level to achieve a desired threshold voltage.

The capacitor 14 comprises a first electrode 22 and a second electrode 24. The electrodes 22 and 24 are spaced from one another, and dielectric material would be between the first and second electrodes. The dielectric material is not shown in FIG. 1 in order to simplify the drawing, but would be similar to the dielectric material 128 described below with reference to FIG. 23.

The electrodes 22 and 24 comprise conductive materials 28 and 30, respectively. Such conductive materials may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 28 and 30 may be the same as one another in some embodiments, and may be different from one another in other embodiments.

In some embodiments, the electrodes 22 and 24 may be respectively referred to as a bottom electrode and a top electrode, a storage node electrode and a plate electrode, a bottom plate and a top plate, etc.

The second source/drain region 21 is coupled with the first electrode 22 of the capacitor 14; and in the illustrated embodiment is directly against the first electrode 22.

A bitline 32 extends through the device 10, and is coupled with the first source/drain region 19. In the illustrated embodiment, the first source/drain region 19 is directly against the bitline 32.

The bitline 32 comprises conductive material 34. The conductive material 34 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

A wordline 36 is coupled with the gate 12. In some embodiments, the device 10 may correspond to a memory cell, and may be one of many memory cells of a memory array (for instance, a DRAM array). The memory cell 10 may be addressed (i.e., read from/written to) utilizing the wordline 36 and the bitline 32.

Figure 2:
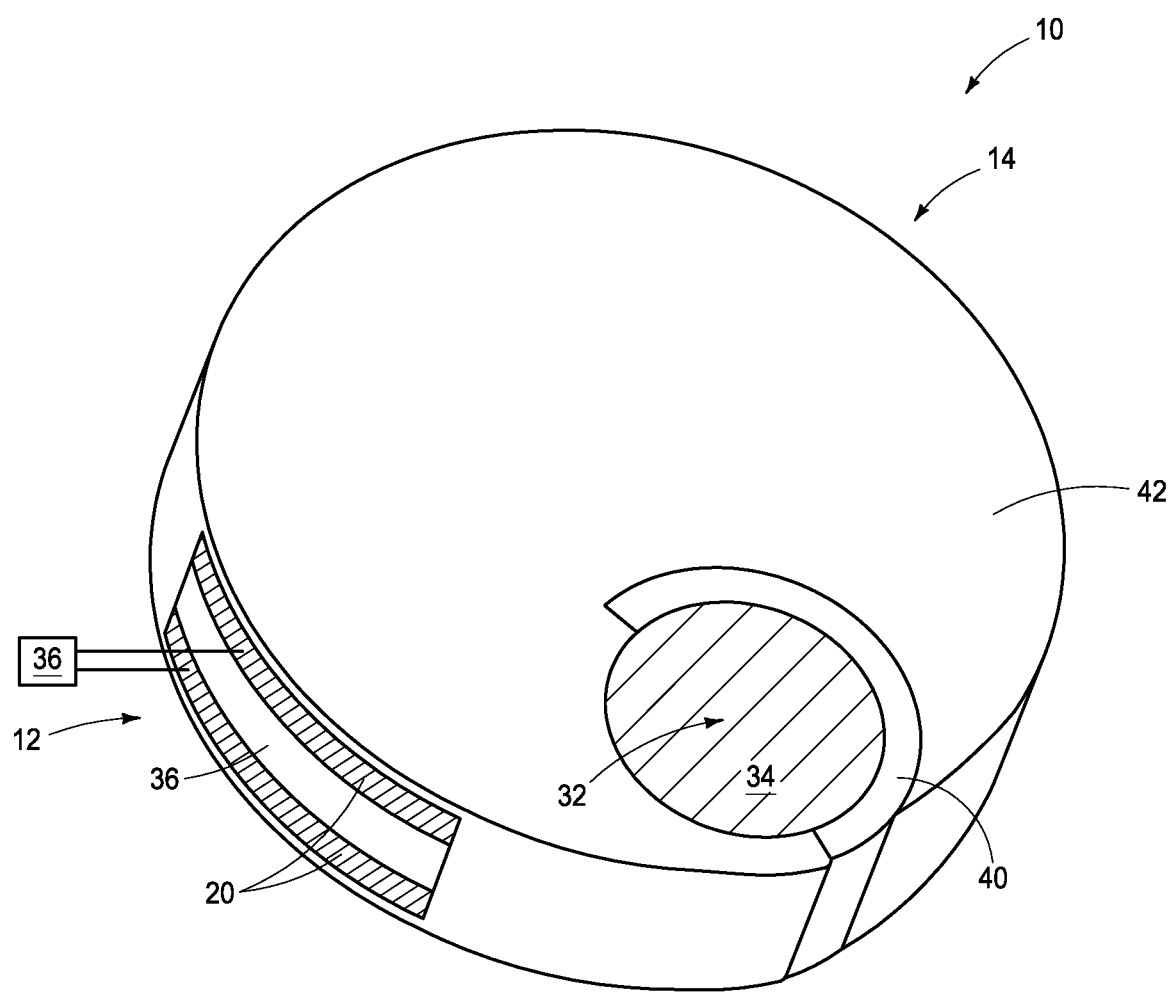
FIG. 2 is another diagrammatic three-dimensional view of the example device of FIG. 1.
Figure 19:
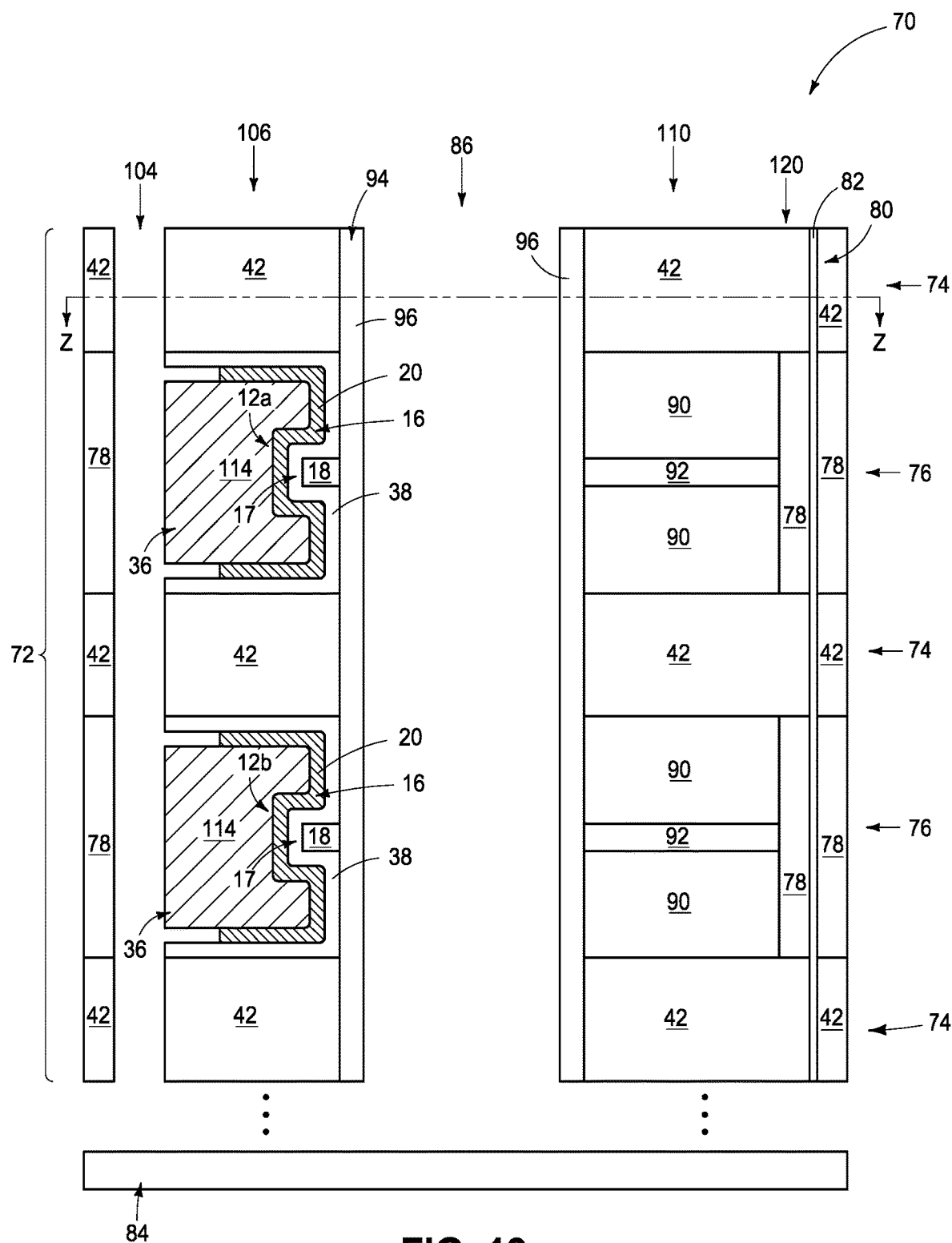

The device 10 may comprise numerous insulative materials which are not shown in the diagram of FIG. 1 in order to simplify the drawing. For instance, the capacitor dielectric material (i.e., the material 128 shown in FIG. 23) has already been mentioned. Also, gate dielectric material would be provided between the gate and the channel region 17 (example gate dielectric material is shown in FIG. 19 as material 38). Further, insulative materials would be provided to surround the device 10, and to isolate the bitline 32 from the capacitor 14. For instance, FIG. 2 shows insulative material 40 provided between the bitline 32 and the capacitor 14, and shows insulative material 42 over the transistor 12 and the capacitor 14.

The insulative materials 40 and 42 may comprise any suitable composition(s); and in some embodiments may comprise one or more of silicon dioxide, silicon nitride, high-k oxides (with high-k meaning a dielectric constant greater than that of silicon dioxide), etc. The insulative materials 40 and 42 may be the same composition as one another in some embodiments, and may be different compositions relative to one another in other embodiments. Further, in some embodiments either or both of the materials 40 and 42 may comprise two or more different materials, rather than the single homogeneous materials illustrated in FIG. 2.

Figure 3:
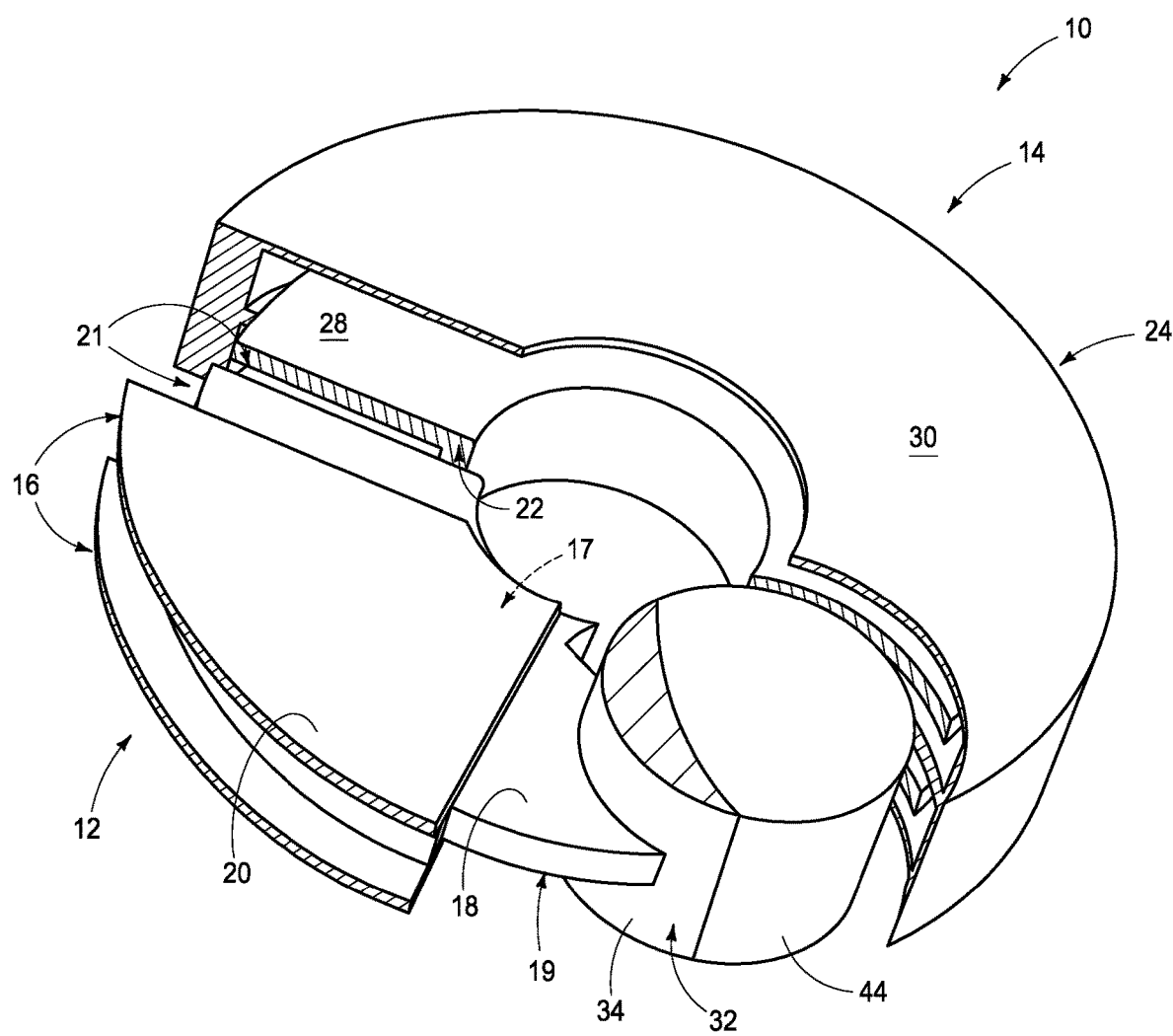
FIGS. 3-5 are diagrammatic three-dimensional views of other example devices.

In some embodiments, the bitline 32 may have a different configuration than shown in FIG. 1. Specifically, FIG. 1 shows the bitline 32 configured to be substantially circular along a horizontal cross-section through the bitline. In other embodiments, the bitline may be polygonal, square, rectangular, elliptical, etc. FIG. 3 shows a configuration in which the bitline 32 is crescent-shaped along a horizontal cross-section through the bitline. The crescent-shaped bitline is along an insulative material 44. Such insulative material may comprise, for example, any of the compositions discussed above with reference to FIG. 2 for the insulative materials 40 and 42. In some embodiments, the insulative material 44 may be the same as one or both of the insulative materials 40 and 42.

Figure 4:
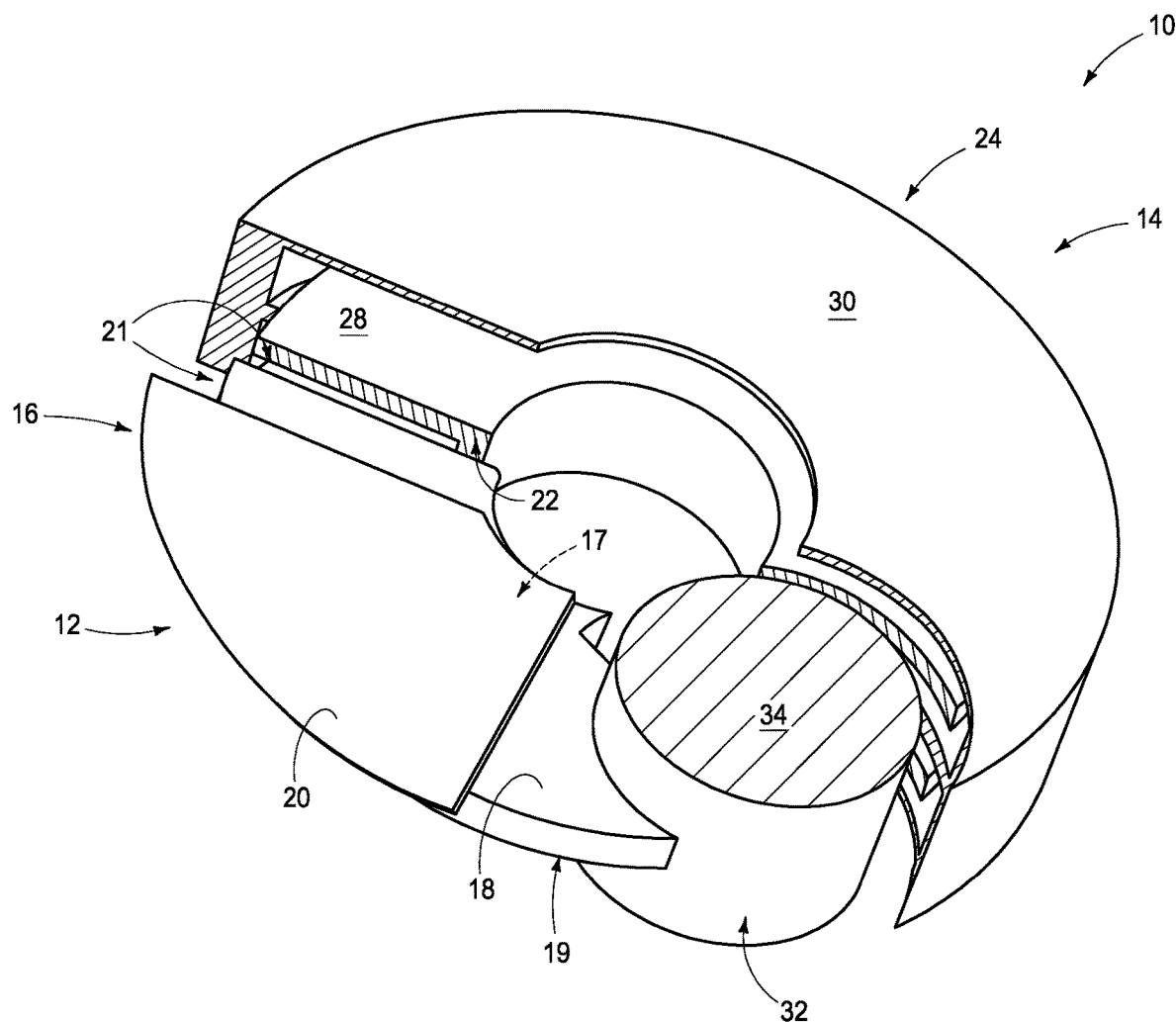
Figure 5:
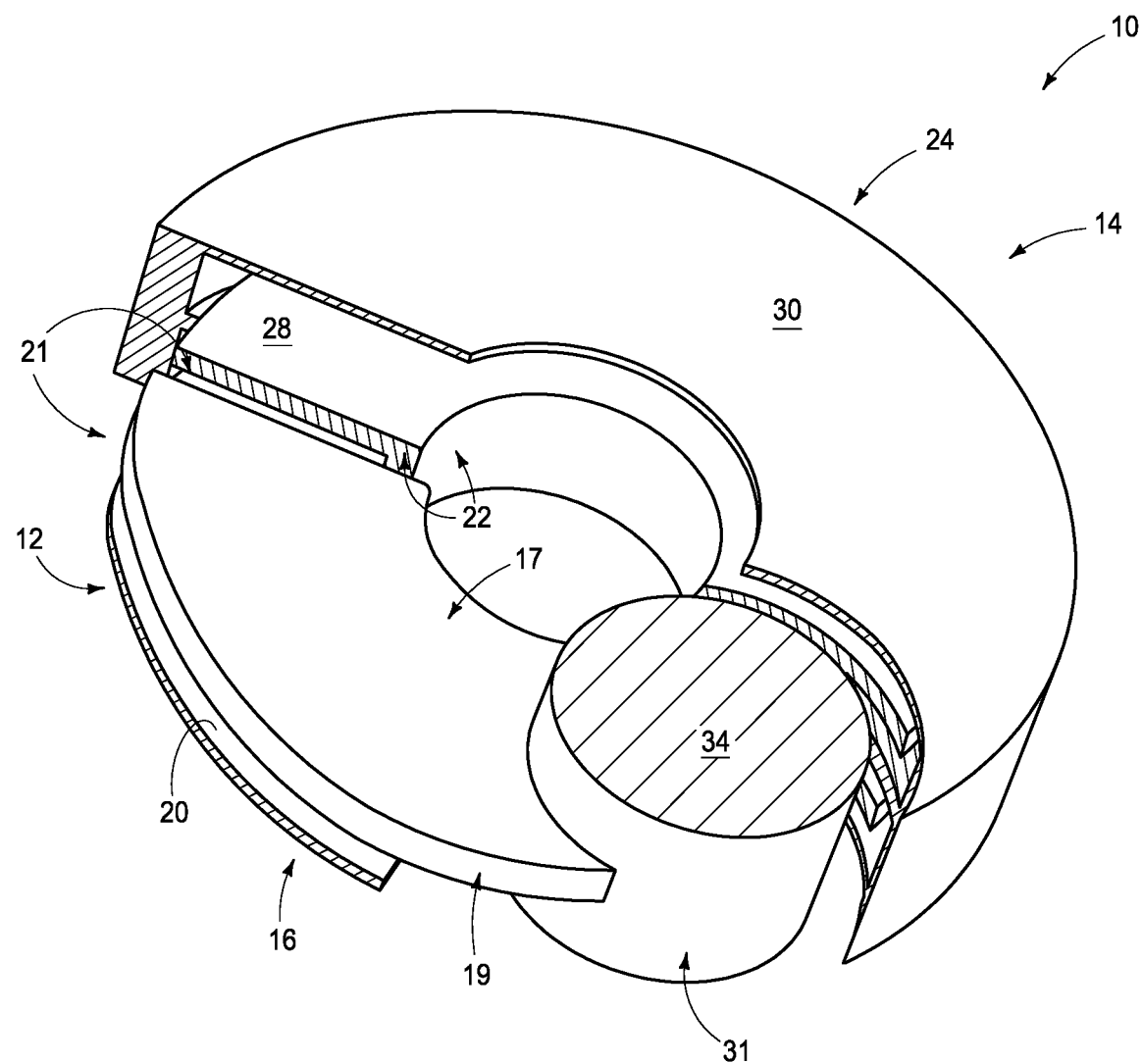

The gate 16 of FIGS. 1 and 3 is illustrated to be in a configuration which brackets the channel region 17 within semiconductor material 18. In other embodiments, the gate 16 may have a different configuration. For instance, FIG. 4 shows a configuration in which the gate 16 is primarily over the channel region 17, and FIG. 5 shows a configuration in which the gate 16 is primarily under the channel region 17. Accordingly, FIGS. 4 and 5 show configurations in which the gate 16 is along one side of the channel region 17, rather than being along two opposing sides of the channel region (i.e., rather than bracketing the channel region).

The devices 10 of FIGS. 1-5 have the capacitor 14 horizontally-offset relative to the transistor 12. Also, all of the devices are substantially circular along horizontal cross-sections through the devices (with the term "substantially circular" meaning circular to within reasonable tolerances of fabrication and measurement). The devices may have other shapes in other embodiments, as discussed in more detail below with reference to FIG. 8.

Figure 6:
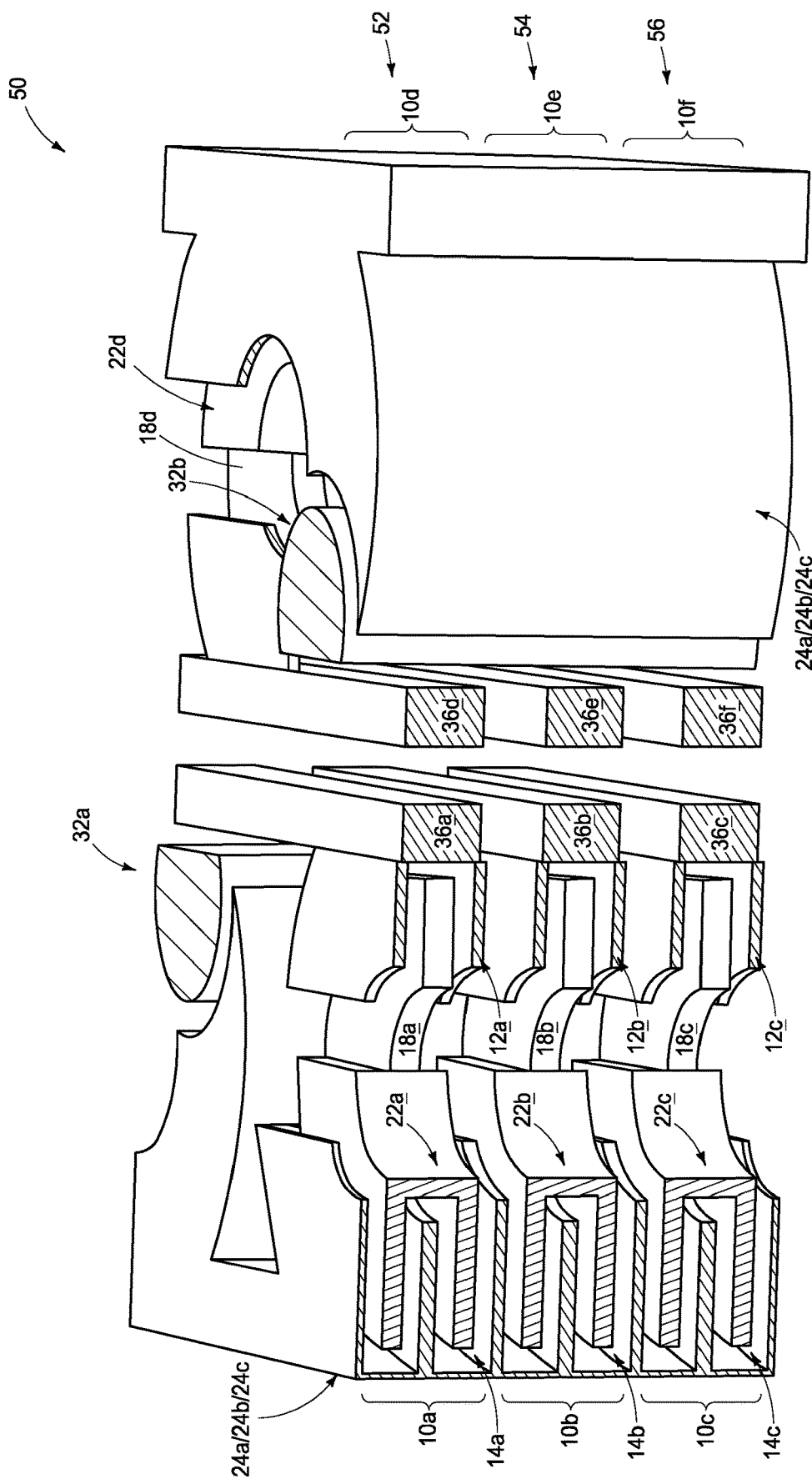
FIG. 6 is a diagrammatic three-dimensional view of a region of an example memory array.

The devices 10 of FIGS. 1-5 may be utilized as memory cells within memory arrays. For instance, FIG. 6, shows an example memory array 50 comprising memory cells 10a-f having the configuration of the device 10 of FIG. 1. Each memory cell comprises a capacitor (e.g., the capacitors 14a-c visible in FIG. 6) coupled with an associated transistor (e.g., the transistors 12a-12c visible in FIG. 6). The capacitors are vertically-stacked one atop another along levels 52, 54 and 56. The level 52 comprises the memory cells 10a and 10d; the level 54 comprises the memory cells 10b and 10e; and the level 56 comprises the memory cells 10c and 10f. Insulative materials are not shown in FIG. 6 in order to simplify the drawing, but it is to be understood that insulative materials analogous those described above with reference to FIGS. 1 and 2 (e.g., capacitor dielectric material, gate dielectric material, etc.) would be provided.

The capacitors comprise the first electrodes (for instance, the electrodes 22a, 22b and 22c) and the second electrodes (for instance, the electrodes 24a, 24b and 24c). In the illustrated embodiment, the second electrodes along each vertical stack are comprised by a single common plate. Accordingly, the electrodes 24a, 24b and 24c are within a common plate labeled 24a/24b/24c; and the electrodes 24d, 24e and 24f are within a common plate labeled 24d/24e/24f. The common plates 24a/24b/24c and 24d/24e/24f may be coupled with one another in some embodiments, and may be held at any suitable voltage (i.e., ground, Vcc/2, etc.).

Wordlines (e.g., access lines, etc.) 36a-f extend horizontally, and are coupled with transistor gates of the memory cells 10a-f (the transistor gates are not labeled in FIG. 6, but would be analogous to the transistor gate 16 of FIG. 1).

Digit lines (e.g. bitlines, senses lines, etc.) extend vertically and are coupled with source/drain regions of the memory cells 10a-f (the source/drain regions are not labeled in FIG. 6, but the digit lines would be coupled to source/drain regions analogous to the source/drain region 19 of FIG. 1).

Each memory cell 10a-f may be uniquely addressed through a combination of one of the digit lines (32a, 32b), and one of the wordlines (36a-f). In some embodiments, the wordlines may be considered to extend along rows of the array of memory cells, and the digit lines may be considered to extend along columns of the array of memory cells.

FIG. 6 shows a region of the memory array 50, and the memory array may comprise numerous other memory cells besides the illustrated six memory cells 10a-f. The memory array may extend vertically above and below the illustrated region, and may extend laterally to the left and right of the illustrated region, as well as into and out of the page relative to the illustrated region. The memory array may comprise any suitable number of memory cells; and in some embodiments may comprise hundreds, thousands, millions, billions, etc., of memory cells.

The memory cells within each level (e.g., the levels 52, 54 and 56) may be substantially identical to one another (with the term "substantially identical" meaning identical to within reasonable tolerances of fabrication and measurement). Further, at least some of the memory cells within one vertical level (e.g., level 52) may be substantially identical to memory cells within another vertical level (e.g., level 54). In some embodiments, all of the memory cells within one vertical level may be substantially identical to all of the memory cells within another vertical level. In some embodiments, all of the memory cells within all of the vertical levels may be substantially identical to one another.

In some embodiments, at least some of the memory cells within one vertical level may not be substantially identical to at least some of the memory cells within another vertical level. Such may enable different vertical levels to be tailored for different applications. Differences between the memory cells in one vertical level relative to the memory cells in another vertical level may provide different performance characteristics amongst transistors of the memory cells (such as, for example, differences in one or more of effective gate width, effective gate length, threshold voltage, on-current, off-current, etc.) and/or different performance characteristics amongst capacitors of the memory cells (such as, for example, differences in capacitance).

In some embodiments, differences in performance characteristics amongst transistors of the memory cells may be achieved by providing different semiconductor material within one level as compared to another level (e.g., the semiconductor material 18a may be different relative to the semiconductor material 18b); with the differences between the semiconductor materials being differences in composition, differences in thickness, and/or differences in any other suitable physical characteristics. Alternatively, or additionally, differences in performance characteristics between one level and another may be achieved by providing different dopants and/or dopant concentrations within the semiconductor material of one level as compared to the semiconductor material of another level (e.g., by providing different dopant and/or dopant concentrations within the semiconductor material 18a as compared to the semiconductor material 18b). Differences in performance characteristics amongst capacitors of different levels may be achieved by, for example, forming the electrodes to be of different shapes amongst the capacitors, utilizing different materials for capacitor dielectric amongst the capacitors and/or by utilizing different thicknesses of capacitor dielectric amongst the capacitors.

Figure 7:
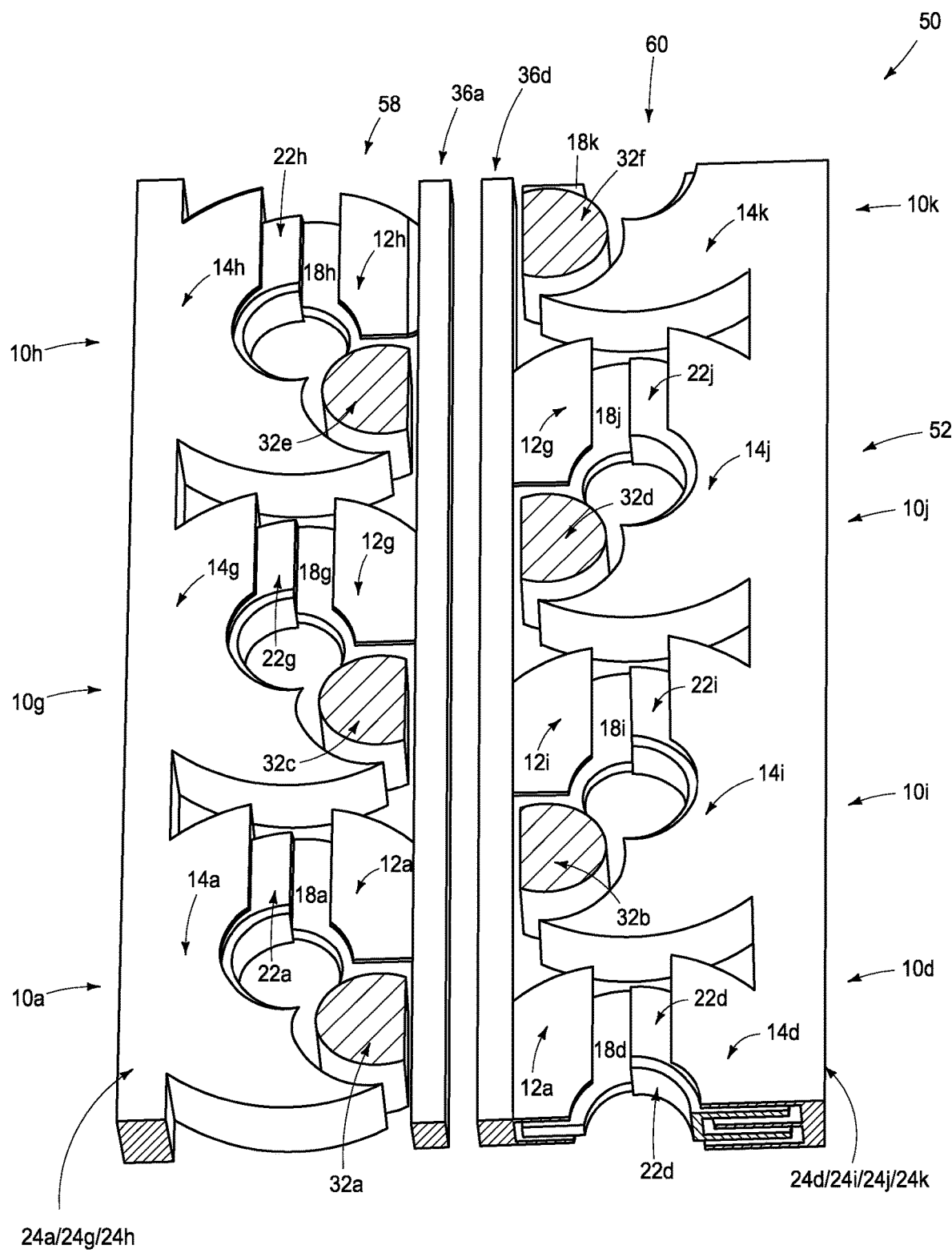
FIG. 7 is another diagrammatic three-dimensional view of a region of the example memory array of FIG. 6.

FIG. 7 shows another view of a region of the memory array 50, and shows a pair of adjacent rows 58 and 60 along the level 52. Insulative materials are not shown in FIG. 7 in order to simplify the drawing, but it is to be understood that insulative materials analogous those described above with reference to FIGS. 1 and 2 (e.g., capacitor dielectric material, gate dielectric material, etc.) would be provided.

The row 58 comprises memory cells 10a, 10g and 10h; and the row 60 comprises memory cells 10d, 10i, 10j and 10k. The embodiment of FIG. 7 illustrates one example arrangement of digit lines (32a-f), and wordlines (36a and 36d) relative to the memory cells. Other arrangements may be utilized in other embodiments.

Figure 8:
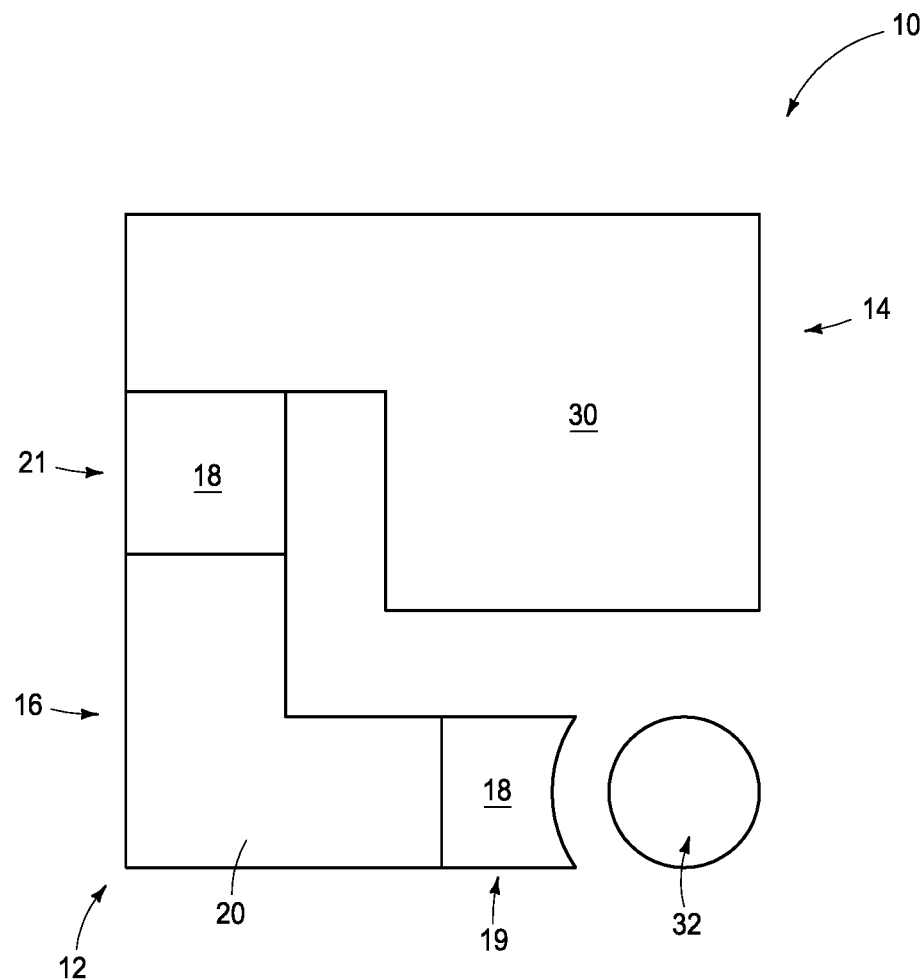
FIG. 8 is a diagrammatic top view of another example device.

Although the memory cells (i.e., devices) of FIGS. 1-7 are illustrated to be substantially circular along horizontal cross-sections through the memory cells, it is to be understood that in other embodiments the memory cells may have other configurations. For instance, FIG. 8 shows a top view of a memory cell 10 in a configuration in which the memory cell has a polygonal shape along a horizontal cross-section through the memory cell. In the illustrated embodiment, the memory cell is substantially square along the horizontal cross-section through the memory cell. In other embodiments, the memory cell may have any other suitable shape.

Insulative materials are not shown in FIG. 8 in order to simplify the drawing, but it is to be understood that insulative materials analogous those described above with reference to FIGS. 1 and 2 (e.g., capacitor dielectric material, gate dielectric material, etc.) would be provided.

Figure 9:
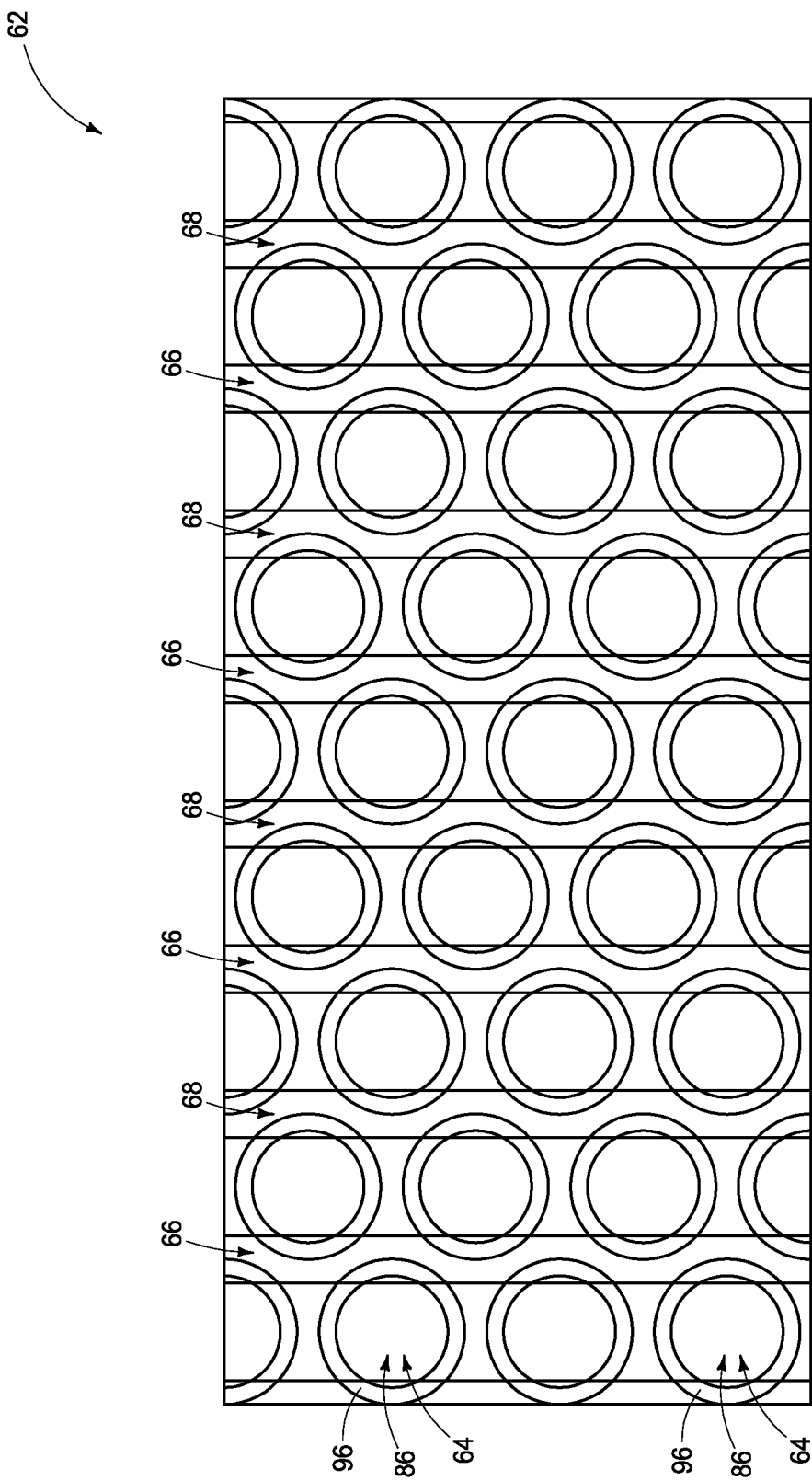
FIG. 9 is a diagrammatic top view of an example assembly at an example process stage.

The devices 10 of FIGS. 1-8 may be fabricated with any suitable processing. In some embodiments, the devices are fabricated by providing holes through a stack of materials. The transistors are formed along a side of the holes, and the capacitors are formed along other sides of the holes. FIG. 9 shows a top view of a construction 62 illustrating example locations 64 for holes 86 (only some which are labeled) utilized during fabrication devices. The holes 86 are lined with a material 96, which is described in more detail below with reference to FIG. 13. FIG. 9 also shows locations 66 where slits will be formed for fabrication of the transistor gates and wordlines, and shows locations 68 where slits will be formed for fabrication of the capacitors. The construction 62 of FIG. 9 is provided to provide the reader with an overview of an example method for fabricating an array of devices (e.g., the example devices 10 of FIGS. 1-8) in accordance with an example embodiment. In other embodiments, the devices may be fabricated utilizing other constructions.

An example method for fabricating devices analogous to the device 10 of FIG. 3 is described with reference to FIGS. 10-23 and 10A-23A. The views of FIGS. 10A-23A are along the cross-sections Z-Z of FIGS. 10-23, respectively; and the views of FIGS. 10-23 are along the lines X-X of FIGS. 10A-23A, respectively. It is to be understood that the example method of FIGS. 10-23 and 10A-23A may be modified to fabricate any of the devices of FIGS. 1-8, or analogous devices.

Figure 10:
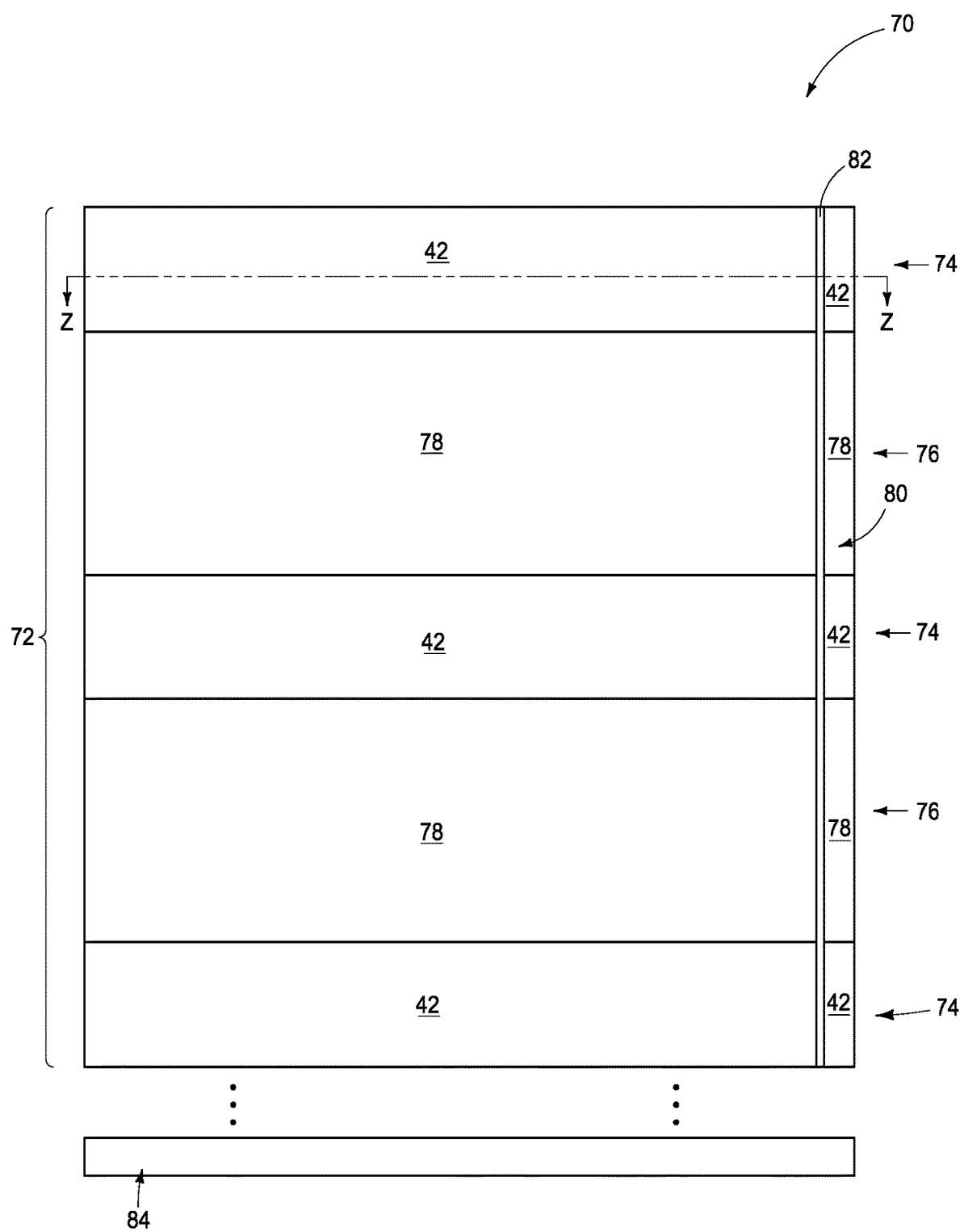
FIGS. 10-23 are diagrammatic cross-sectional side views of a region of an example assembly at example process stages.
Figure 10A:
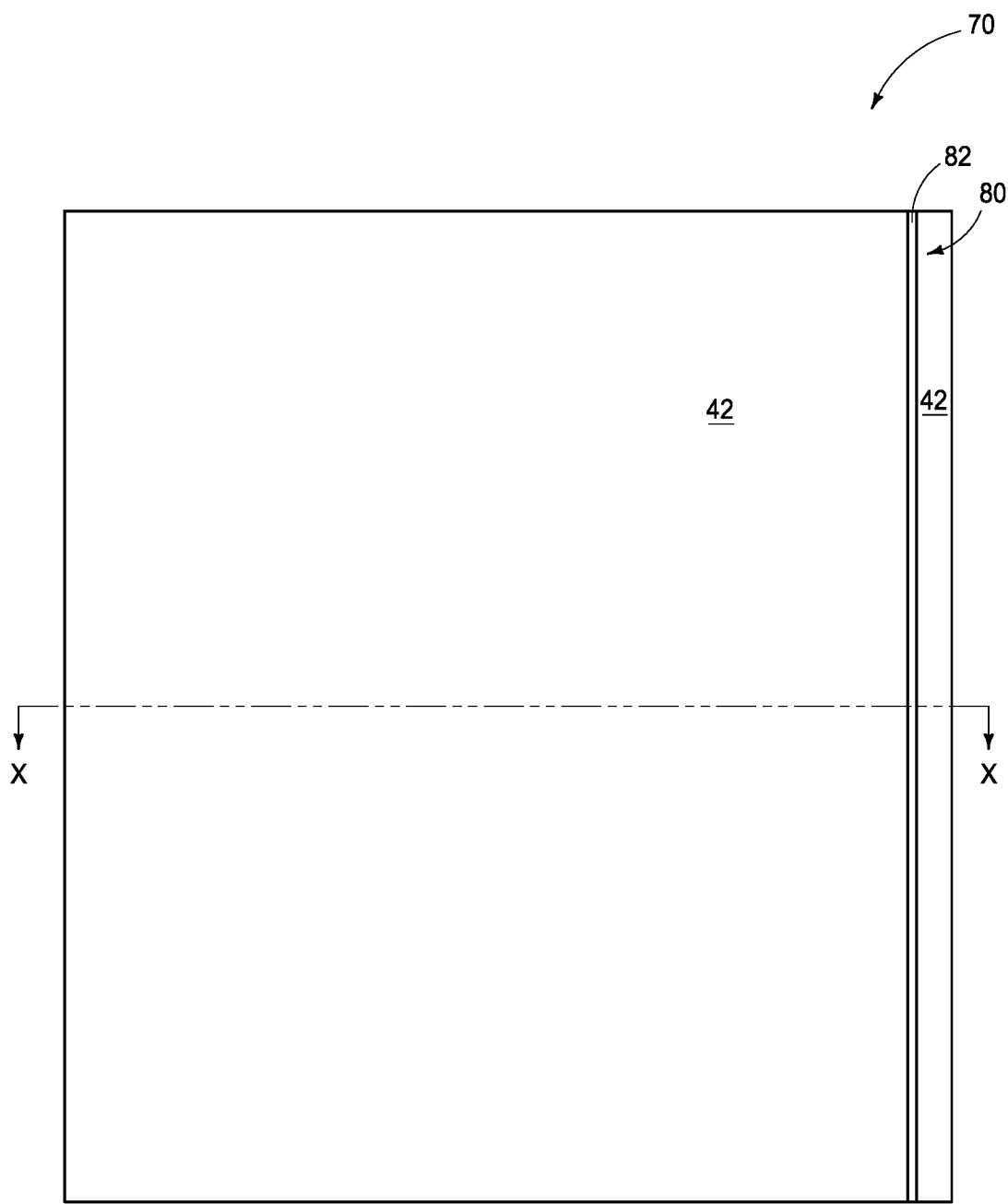

Referring to FIGS. 10 and 10A, an assembly 70 comprises a stack 72 of first levels 74 and second levels 76. The levels 74 and 76 alternate with one another along a vertical direction.

The first levels 74 may comprise insulative material 42, and may be referred to as insulative levels. The insulative material 42 may comprise any suitable composition(s); and in some embodiments may comprise, consist essentially of, or consist of silicon nitride. The insulative material 42 of first levels 74 may be the same as that described above with reference to FIG. 2.

The second levels 76 comprise sacrificial material 78. The sacrificial material 78 is a material selectively removable relative to the insulative material 42. In some embodiments, the sacrificial material 78 may comprise, consist essentially of, or consist of silicon dioxide. For instance, the sacrificial material 78 may comprise silicon dioxide which is effectively not doped with boron, phosphorus, or other dopants. Such sacrificial material may be referred to as a non-doped silicate glass (NSG). It may be difficult to have absolutely no dopant within silicate glass, and thus the NSG is referred to as being "effectively not doped". In some embodiments, the dopant level of the NSG may be less than or equal to about $10^{15}$ atoms/cm$^3$.

The second levels 76 may be referred to as device levels, since integrated devices are eventually formed within the second levels 76.

An insulative panel 80 extends through the stack 72. The insulative panel 80 comprises an insulative material 82. The material 82 may comprise any suitable composition or combination of compositions; and in some embodiments may comprise a same composition as the insulative material 42. For instance, the materials 82 and 42 may both comprise, consist essentially of, or consist of silicon nitride in some embodiments. The panel 80 may be utilized to define edges of capacitors at processing stages described below with reference to FIGS. 20 and 21. In some embodiments, such edges may be defined without utilization of the panel 80; and accordingly the panel 80 may be omitted.

The stack 72 is supported by a base 84. The base 84 may comprise semiconductor material; and may, for example, comprise, consist essentially of, or consist of monocrystalline silicon. The base 84 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 84 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 72 and the base 84 to indicate that there may be other materials, components, etc., provided between the stack 22 and the base 84 in some embodiments. Alternatively, the stack 72 may be provided directly against an upper surface of the base 84.

Figure 11:
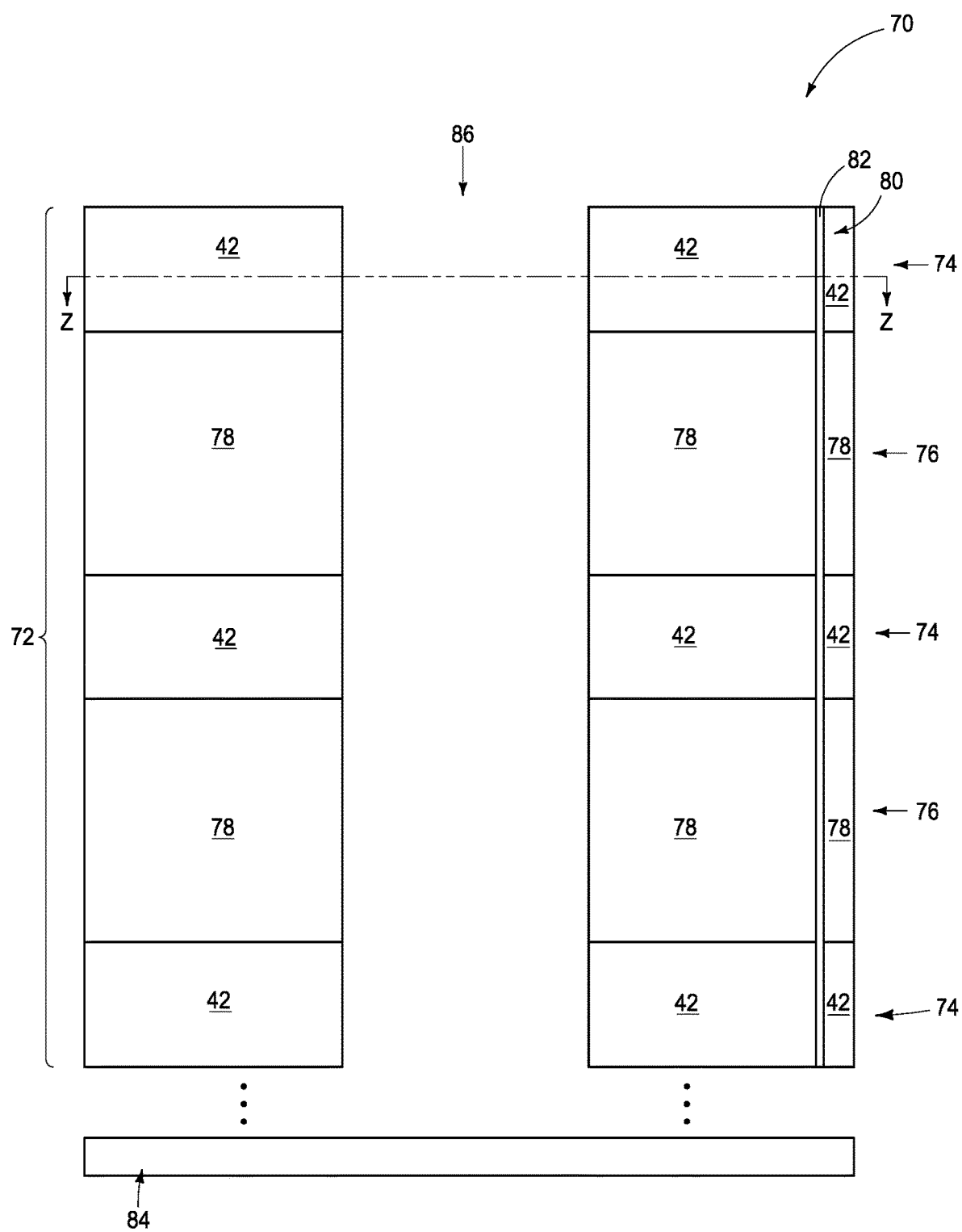
Figure 11A:
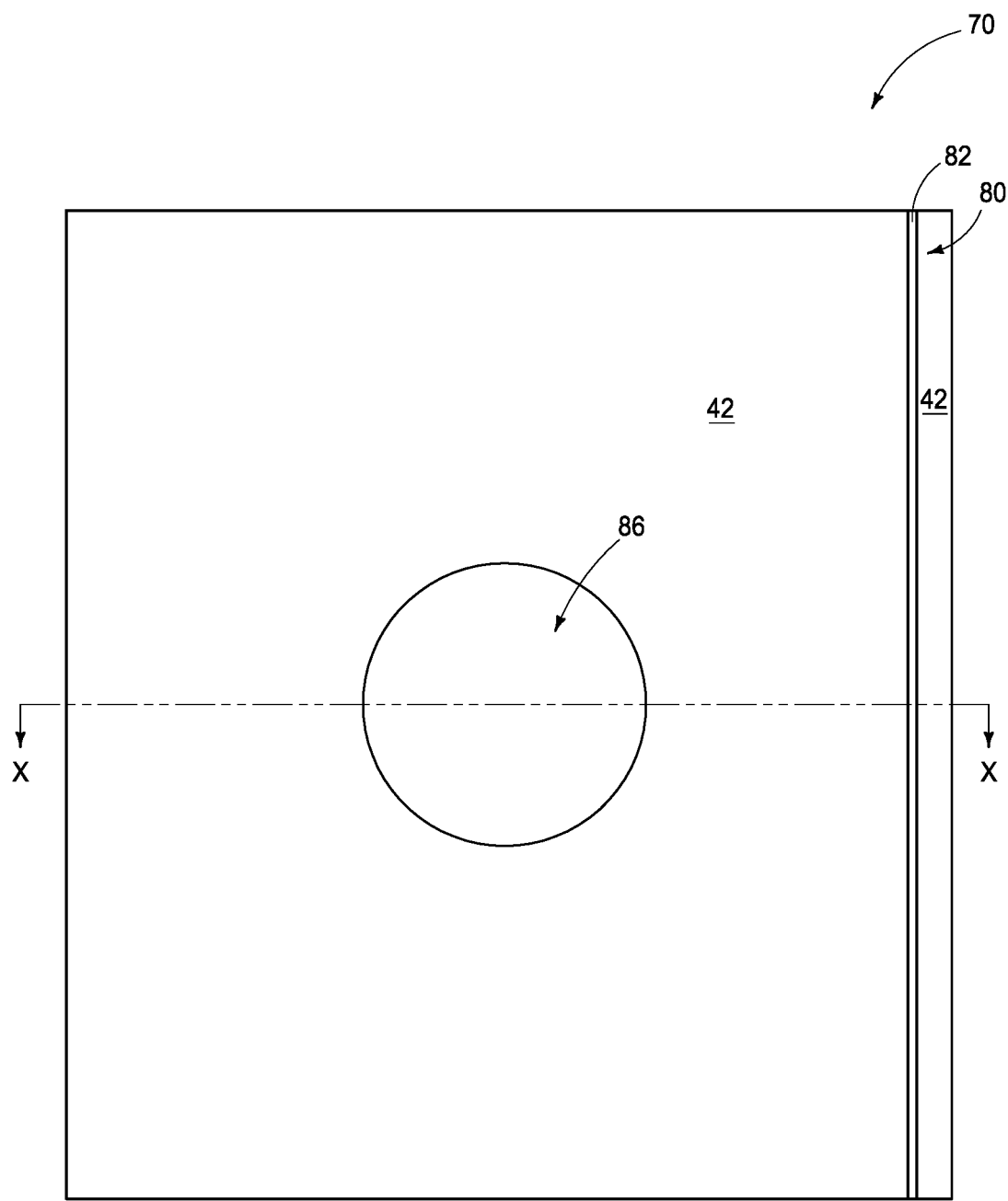

Referring to FIGS. 11 and 11A, an opening 86 is formed through the stack 72. The opening 86 may be referred to as a first opening, and may be representative of a plurality of openings formed through the stack 74 (a plurality of openings 86 is shown in FIG. 9, and discussed above). Only a single opening 86 is shown in the views of FIGS. 11 and 11A in order to simplify the drawings, but it is to be understood that such opening may be one of a large number of substantially identical openings formed through the stack.

Figure 12:
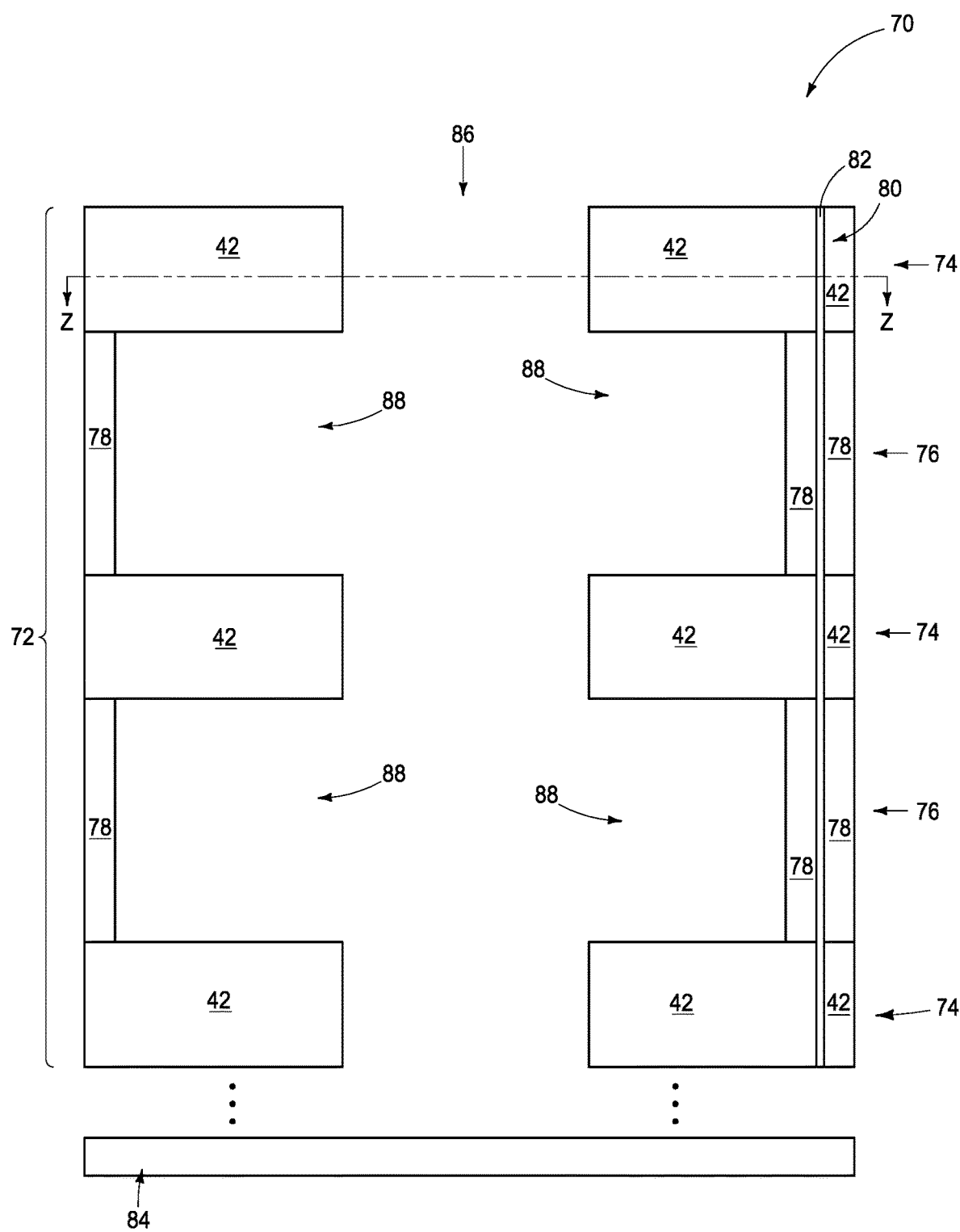
Figure 12A:
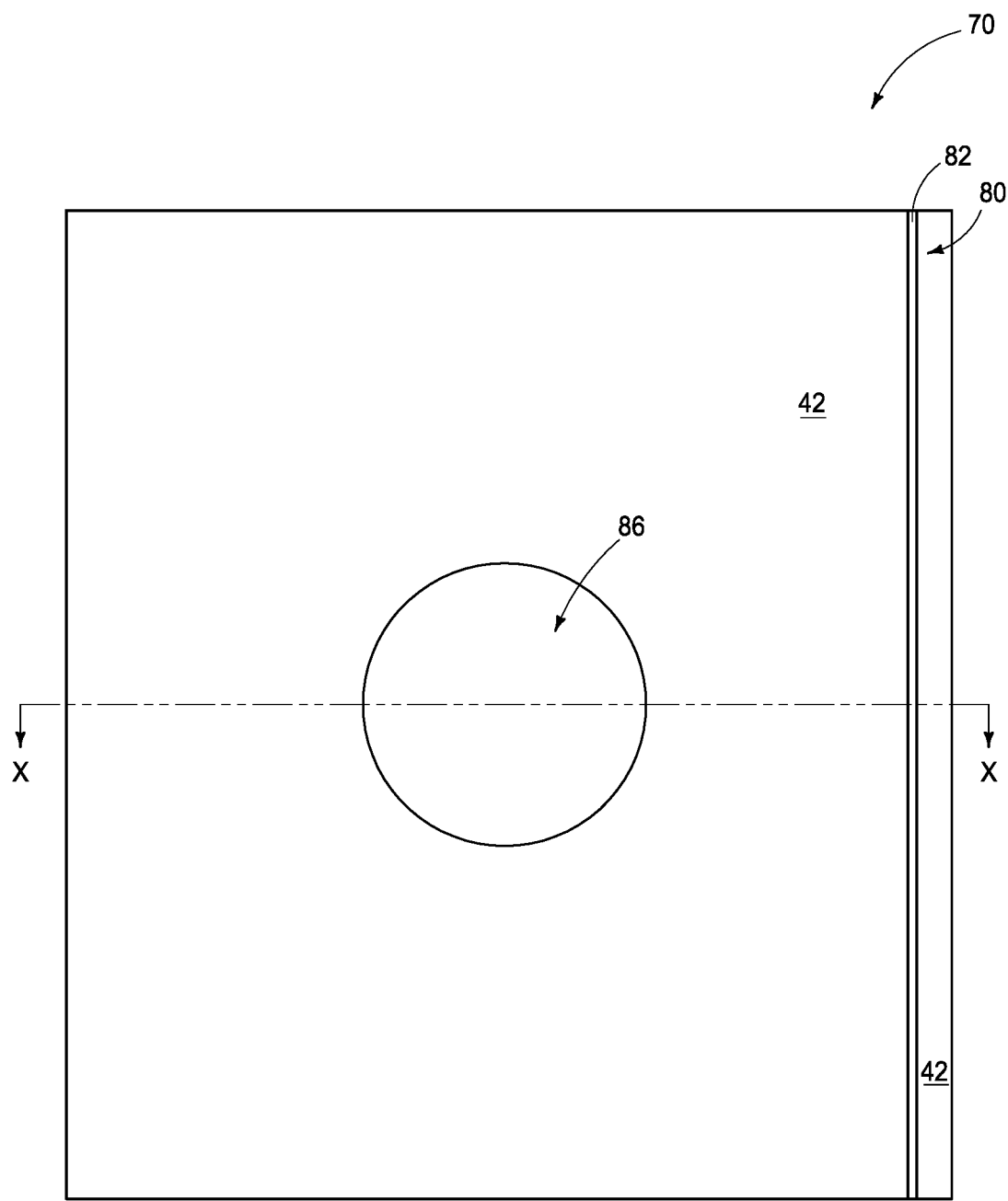

Referring to FIGS. 12 and 12A, the sacrificial material 78 is recessed relative to the insulative material 42 to form cavities 88.

Figure 13:
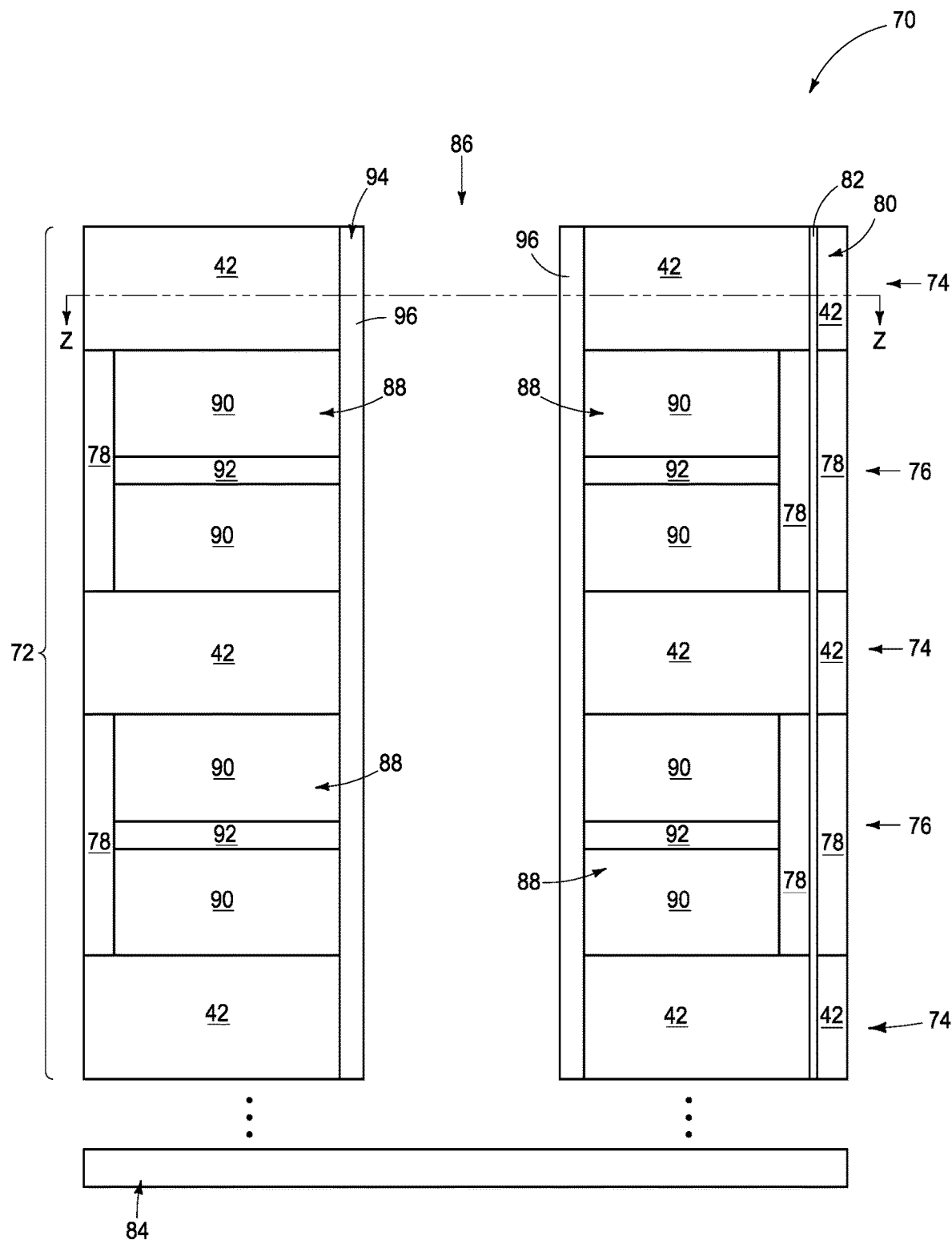
Figure 13A:
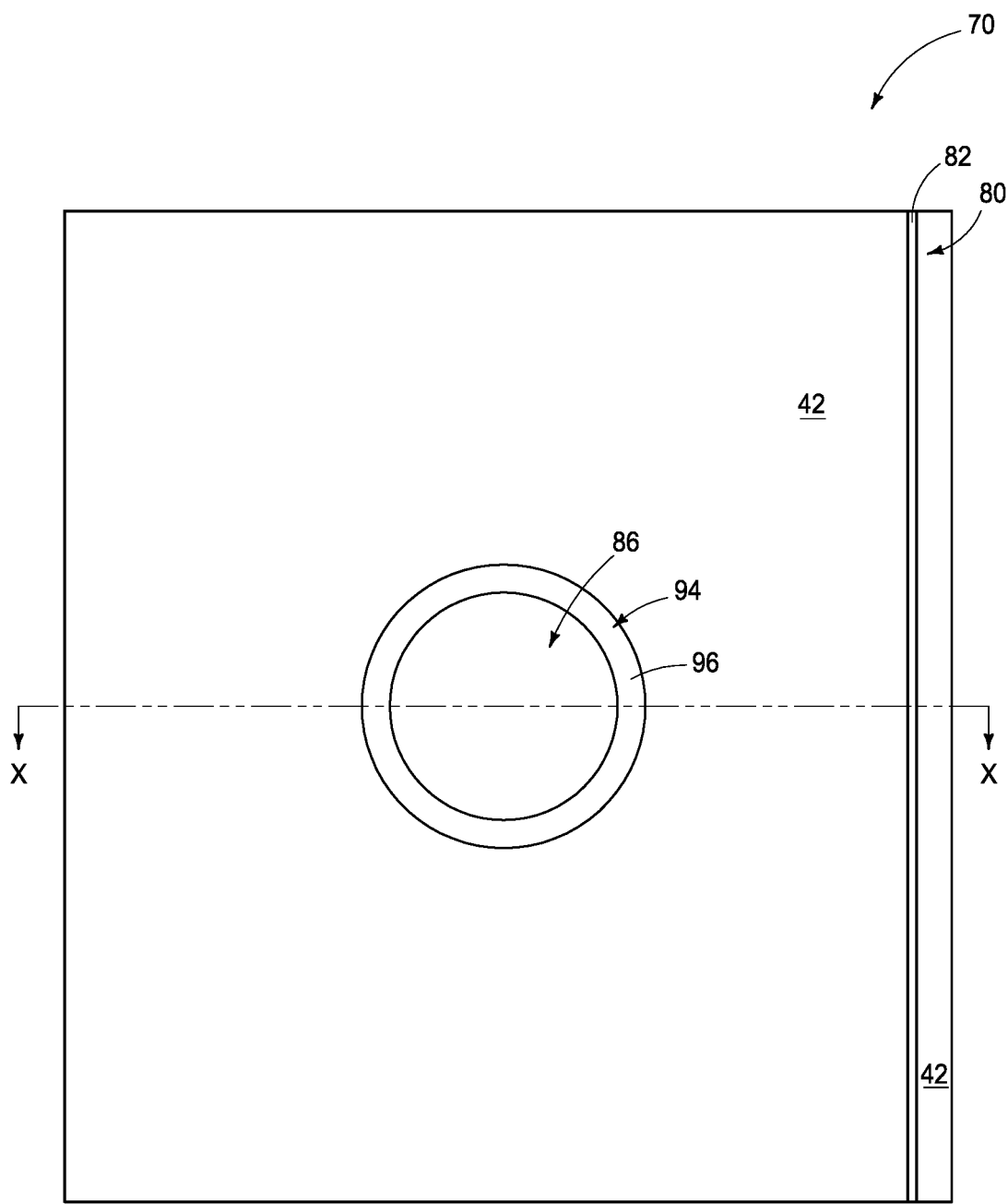
FIG. 13B is a diagrammatic top-down sectional view of the example assembly of FIG. 13A at an example process stage subsequent to that of FIG. 13A.

Referring to FIGS. 13 and 13A, sacrificial materials 90 and 92 are formed within the cavities 88, and then an insulative liner 94 is formed along a peripheral boundary of the opening 86. In the illustrated embodiment, a layer of the first material 92 is provided between a pair of layers of the second material 90 within each of the cavities 88.

The sacrificial materials 90 and 92 may comprise any suitable compositions or combinations of compositions. It can be desired that the second sacrificial material 92 be selectively removable relative to the first sacrificial material 90. In some embodiments, the sacrificial material 90 may comprise, consist essentially of, or consist of NSG, and may be the same as the sacrificial material 78. The sacrificial material 92 may comprise a doped silicate glass; and in some embodiments may comprise, consist essentially of, or consist of phosphosilicate glass. The doped silicate glass comprises a higher concentration of dopant (e.g., phosphorus) than the NSG, and in some embodiments may comprise a dopant concentration of at least about $10^{16}$ atoms/cm$^3$.

The liner 94 comprises an insulative material 96. The material 96 may comprise any suitable composition or combination of compositions; and in some embodiments may comprise, consist essentially of, or consist of silicon nitride.

Figure 13B:
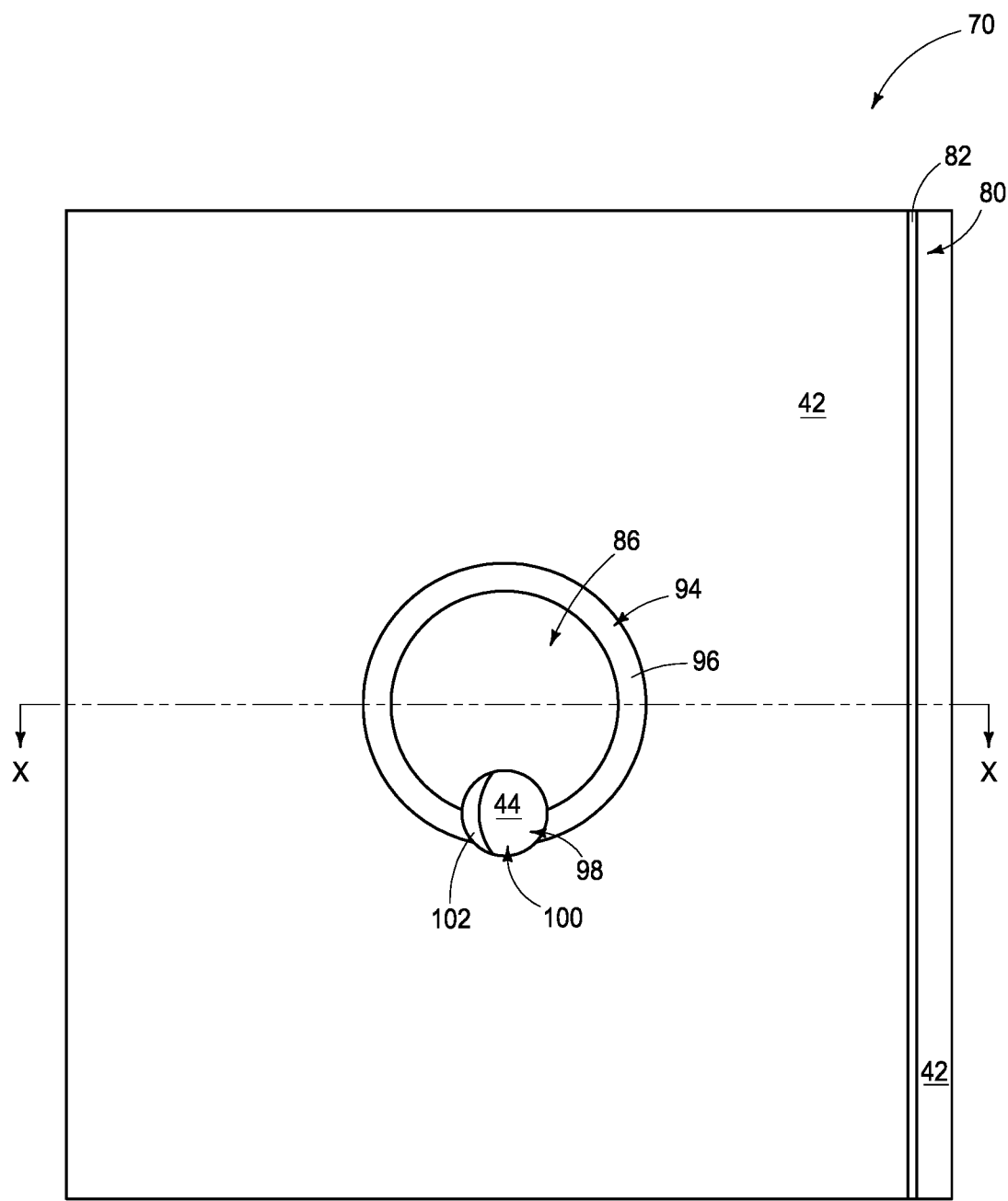

Referring to FIG. 13B, construction 70 is shown at a processing stage subsequent to that of FIG. 13A. A second opening 98 is formed overlapping a region of the first opening 86, and the second opening 98 is filled with a digit line template 100. The digit line template 100 extends vertically through the stack 72. In the illustrated embodiment, the digit line template comprises two materials 44 and 102. The material 44 may comprise any of the insulative compositions described above with reference to FIG. 3. The material 102 is a sacrificial material, and in some embodiments may comprise, consist essentially of, or consist of phosphosilicate glass. The illustrated digit line template 100 comprising the two materials 44 and 102 will ultimately form a digit line 32 having the configuration shown in FIG. 3 as being crescent-shaped along a horizontal cross-section. In other embodiments, the digit line template 100 may comprise only the sacrificial material 102, and may be utilized to form a digit line 32 having the configuration shown in FIG. 1 as being circular shaped along a horizontal cross-section. Alternatively, the sacrificial material 102 may be in any other suitable shape for forming a desired digit line configuration.

Figure 14:
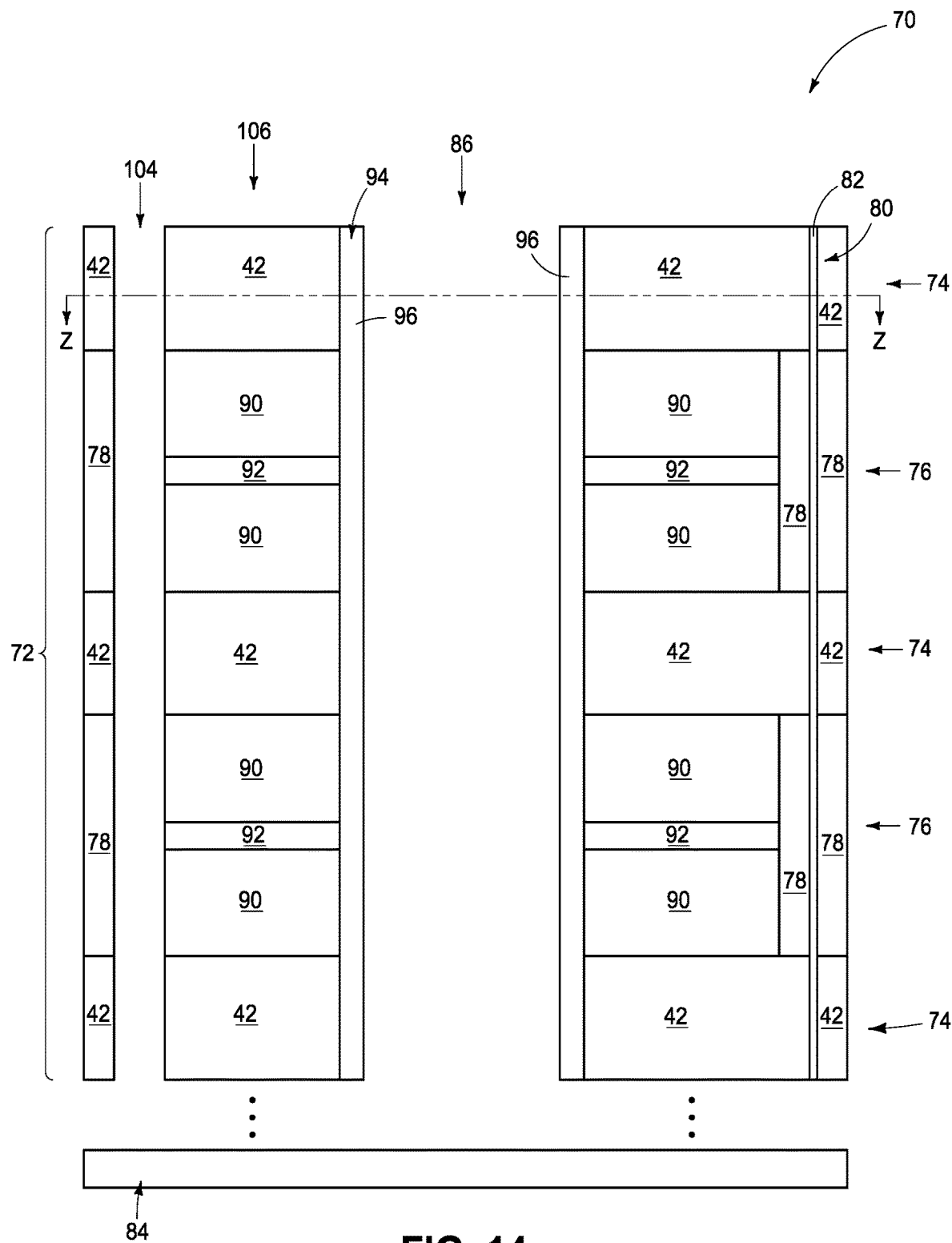
Figure 14A:
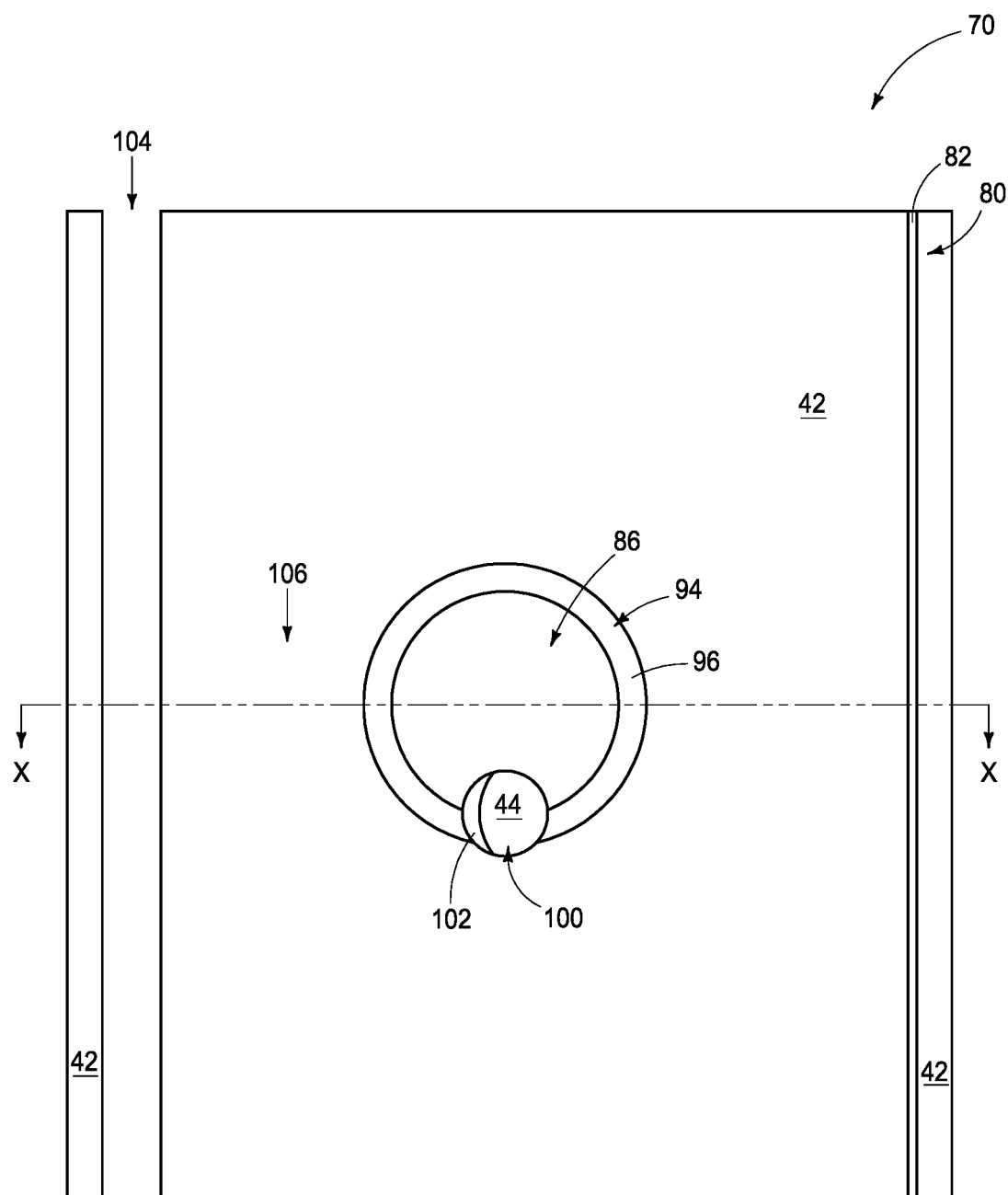

Referring to FIGS. 14 and 14A, a slit 104 is formed along a first side 106 of the opening 86. The slit 104 penetrates through the materials 42, 90 and 92.

Figure 15:
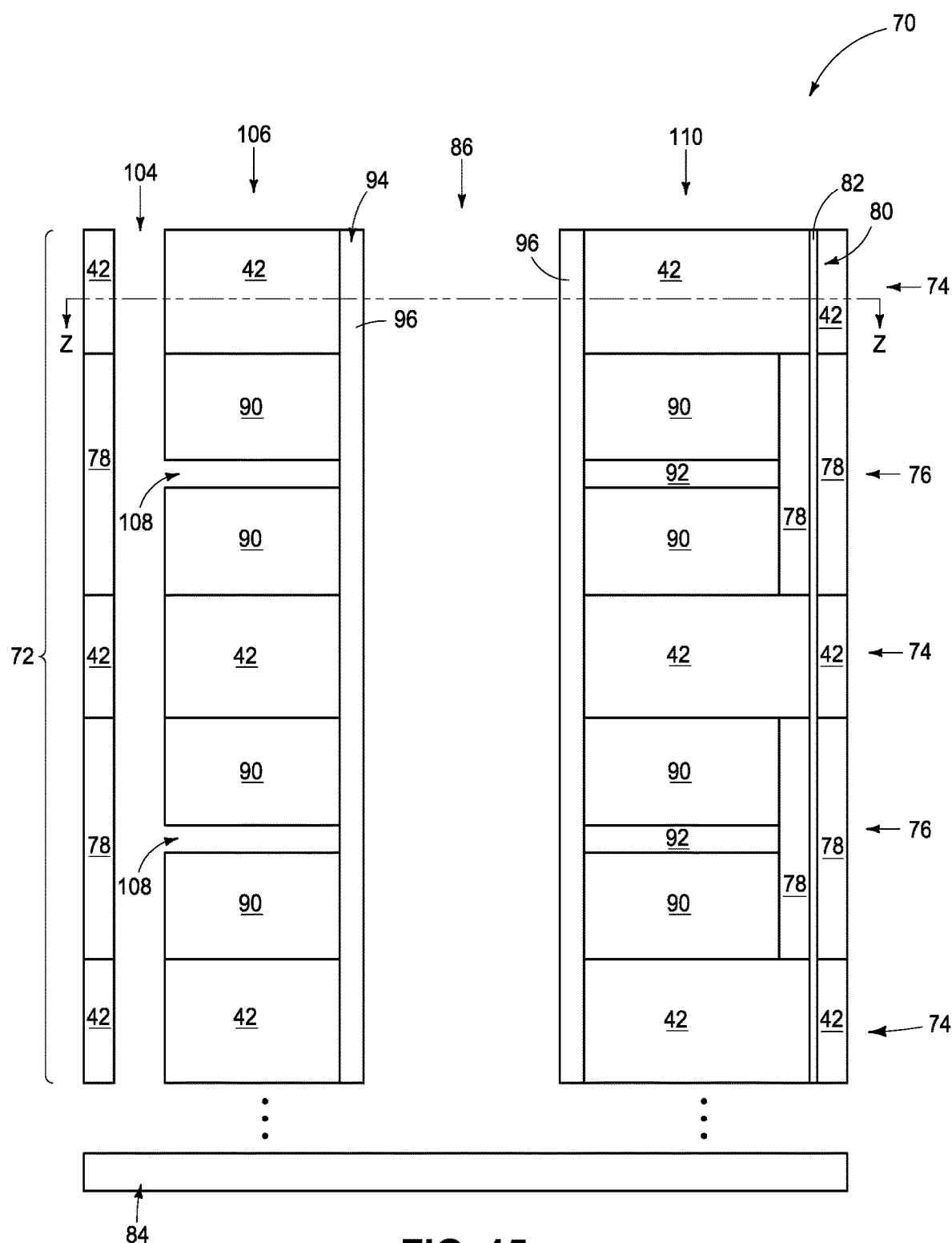
Figure 15A:
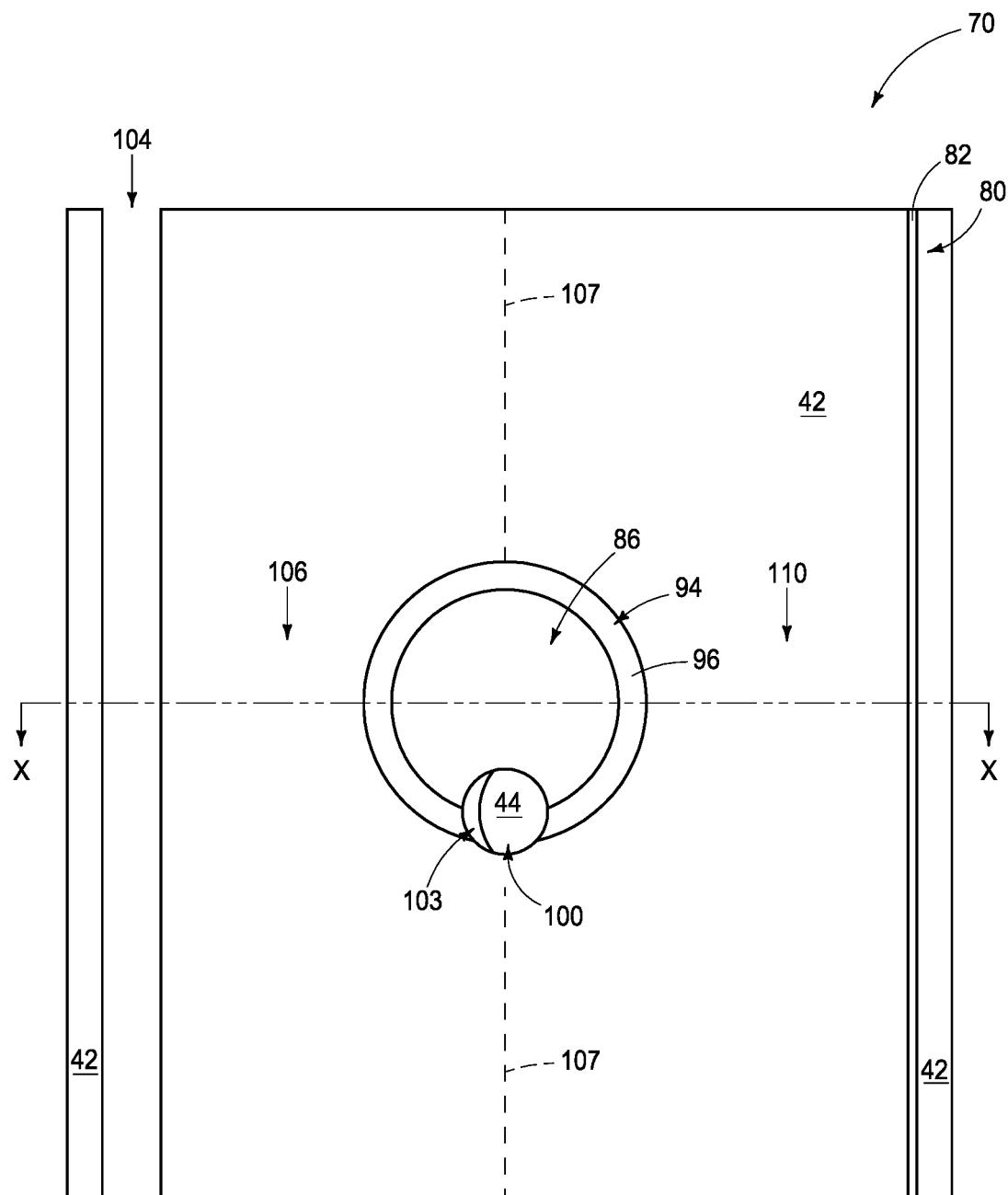

Referring to FIGS. 15 and 15A, the sacrificial material 92 is removed from along the slit 104 to form horizontally-extending voids 108. Such removal may be accomplished by passing appropriate etchant into the slit 104, and utilizing a timed etch to remove a desired amount of the sacrificial material 92. The voids 108 may be formed to extend about halfway around opening 86. Such is diagrammatically illustrated in the top view of FIG. 15A utilizing a dashed line 107 to illustrate approximate lateral boundaries (i.e., edges) of the voids 108 within the stack 72. The voids 108 will be along the left side (the first side 106) of the opening 86, and remaining portions of the sacrificial material 92 will be along the right side of the opening 86. Such right side of the opening may be referred to as a second side 110.

In some embodiments, the sacrificial material 102 of the digit line template 100 may comprise a same composition as the sacrificial material 92 (e.g., both may comprise phosphosilicate glass). Accordingly, the sacrificial material 102 of the digit line template 100 may be removed simultaneously with the removal of the sacrificial material 92 to leave a void 103.

Figure 16:
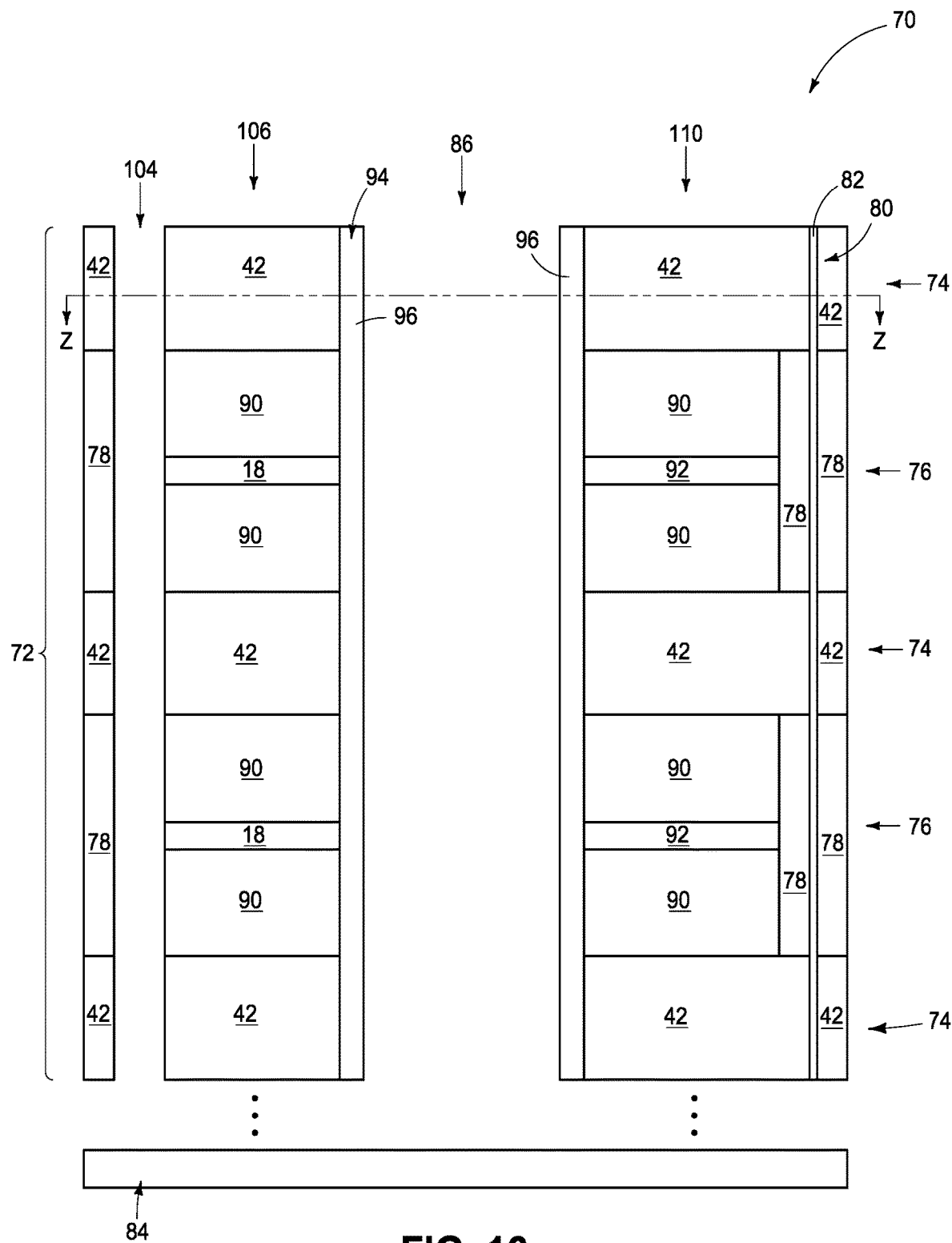
Figure 16B:
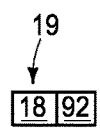
FIGS. 16B and 16C are diagrammatic cross-sectional views of example structures that may be within regions labeled 16A and 16B in the top-down view FIG. 16A.
Figure 16C:
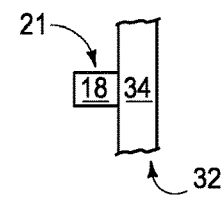
Figure 16A:
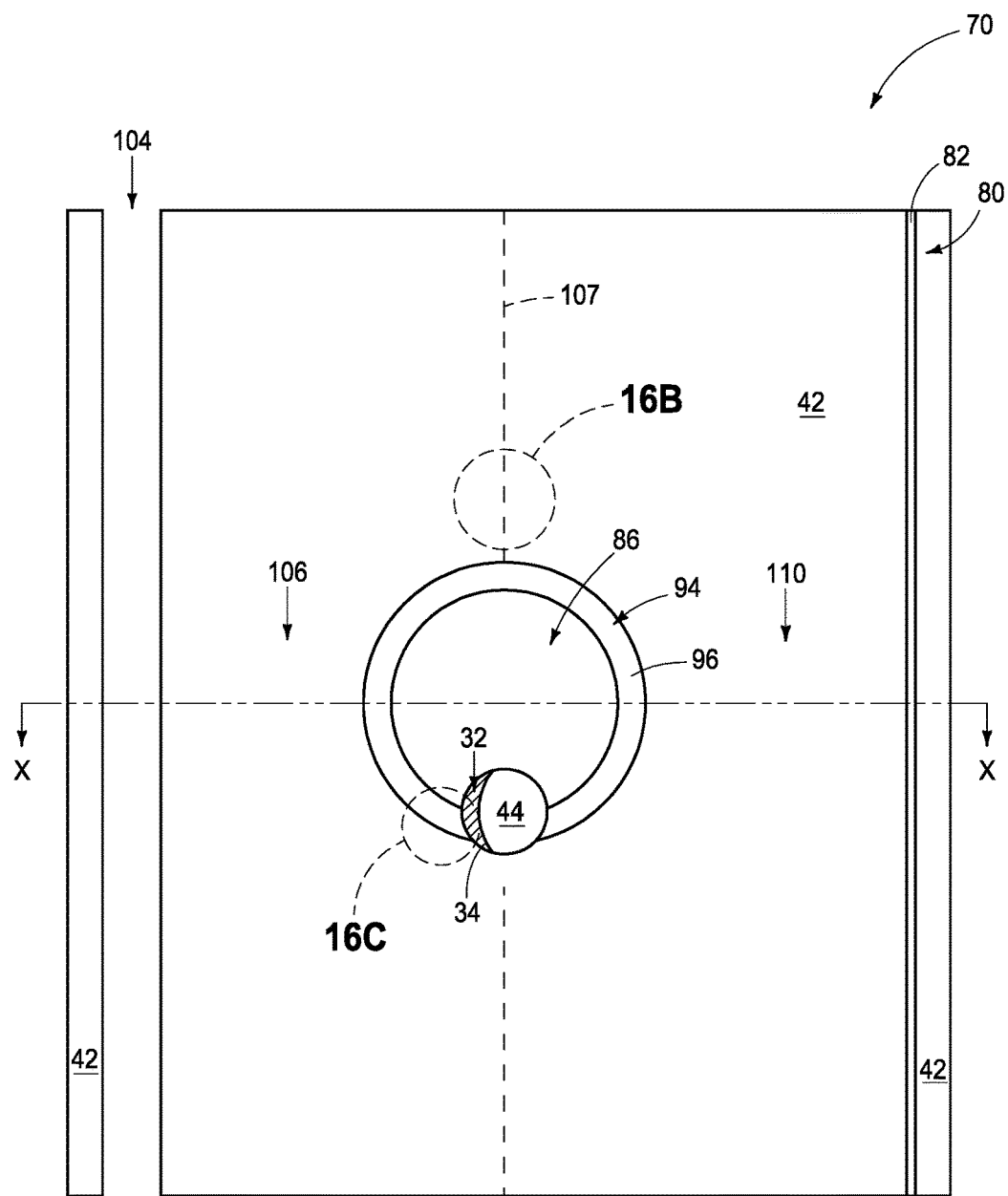

Referring to FIGS. 16 and 16A, semiconductor material 18 is provided within the horizontally-extending voids 108 (FIG. 15), and such semiconductor material replaces the sacrificial material 92 which had been removed to form such voids. The semiconductor material 18 may abut the sacrificial material 92 along the edges of the previous voids 108 (with such edges being diagrammatically illustrated as being approximately along a location of the dashed line 107 of FIG. 16A). FIG. 16B shows a region along the edge within one of the levels 76 of stack 72, and shows the semiconductor material 18 directly against the sacrificial material 92.

The void 103 (FIG. 15A) may be filled with conductive material 34 to form the digit line 32. In some embodiments, the conductive material may comprise conductively-doped silicon and/or metal. A region of the semiconductor material 18 may be directly against the conductive material 34. FIG. 16C shows a region within one of the levels 76 of stack 72 where the semiconductor material 18 contacts the conductive material 34.

In some embodiments, construction 70 may be heated or otherwise operably processed to cause out-diffusion of phosphorus from phosphosilicate glass of sacrificial material 92 into the semiconductor material 18 to form the first source/drain region 19; and to cause out-diffusion from conductively-doped semiconductor material of the digit line 32 into the semiconductor material 18 to form the second source/drain region 21.

Although the semiconductor material 18 is shown to be the same in all of the vertically-stacked levels 76, in other embodiments the semiconductor material within one of the vertically-stacked levels 76 may be different than that within another of the vertically-stacked levels 76. Such may enable fabrication of vertically-stacked transistor devices having different performance characteristics relative to one another; with the vertically-stacked transistor devices being shown in FIG. 20 as devices 12a and 12b.

Figure 17:
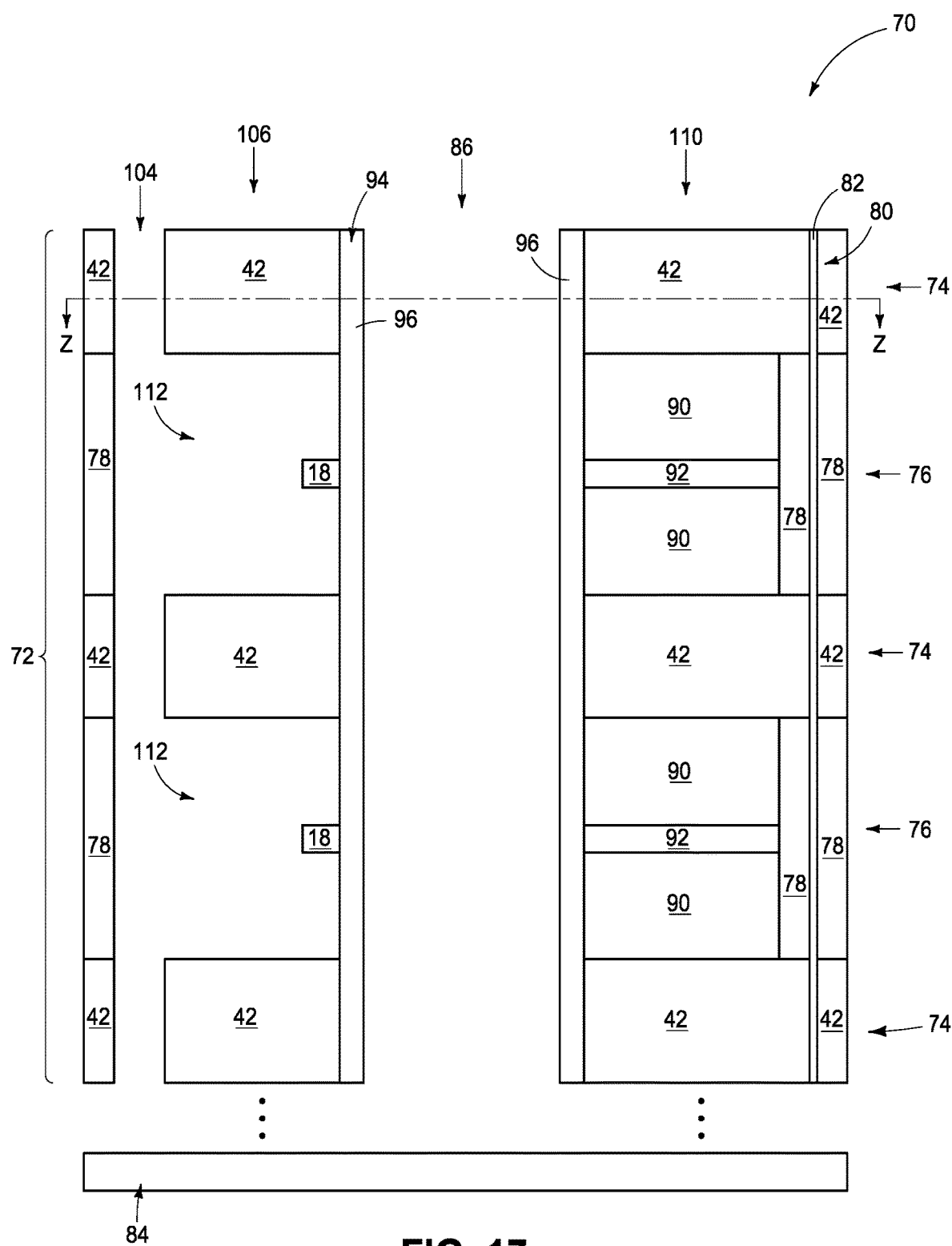
Figure 17A:
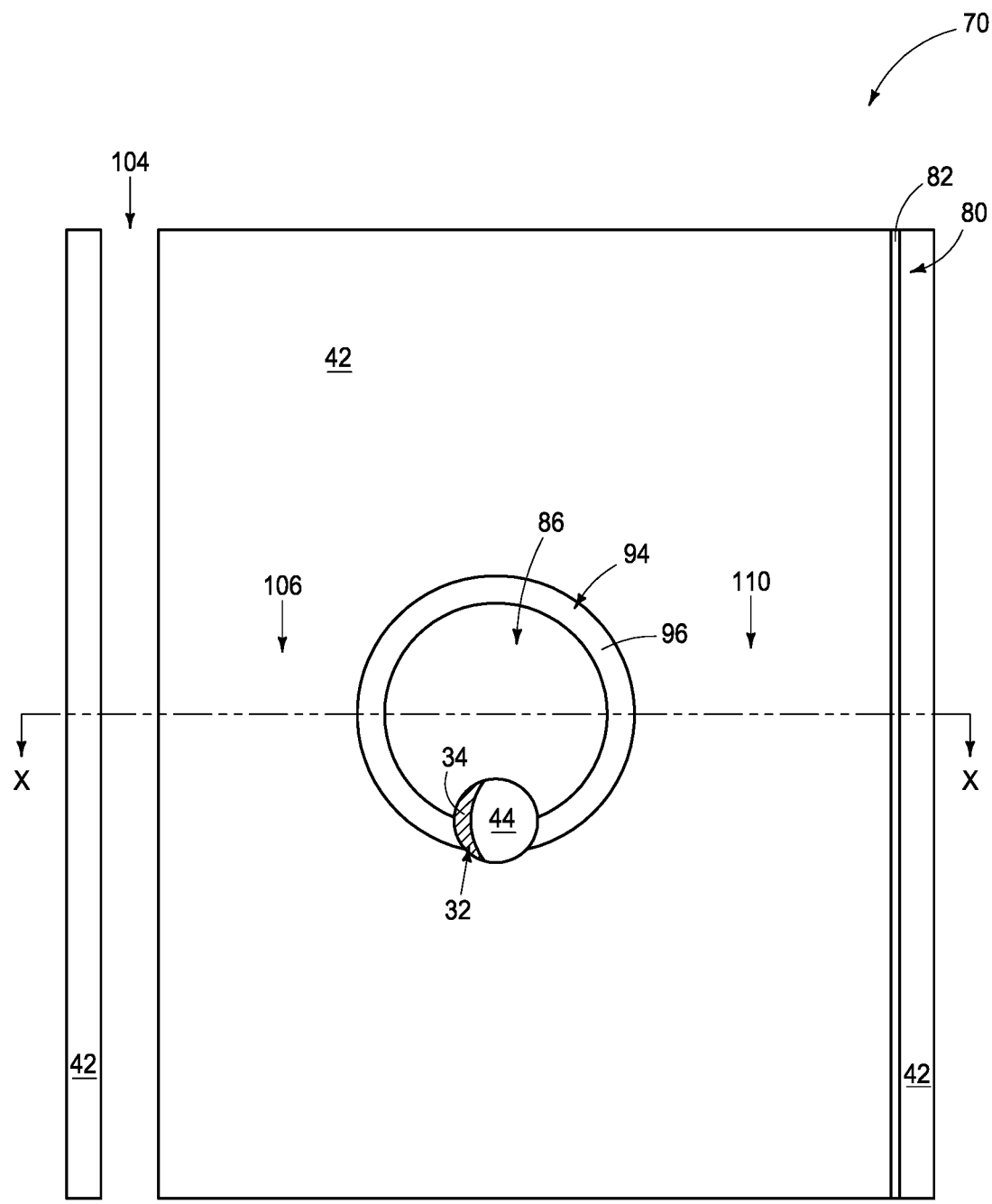

Referring to FIGS. 17 and 17A, the sacrificial material 90 is removed from along the first side 106 of the opening 86, together with a portion of the semiconductor material 18, to leave cavities 112. Such removal may be accomplished by flowing one or more suitable etchants into the slit 104.

Figure 18:
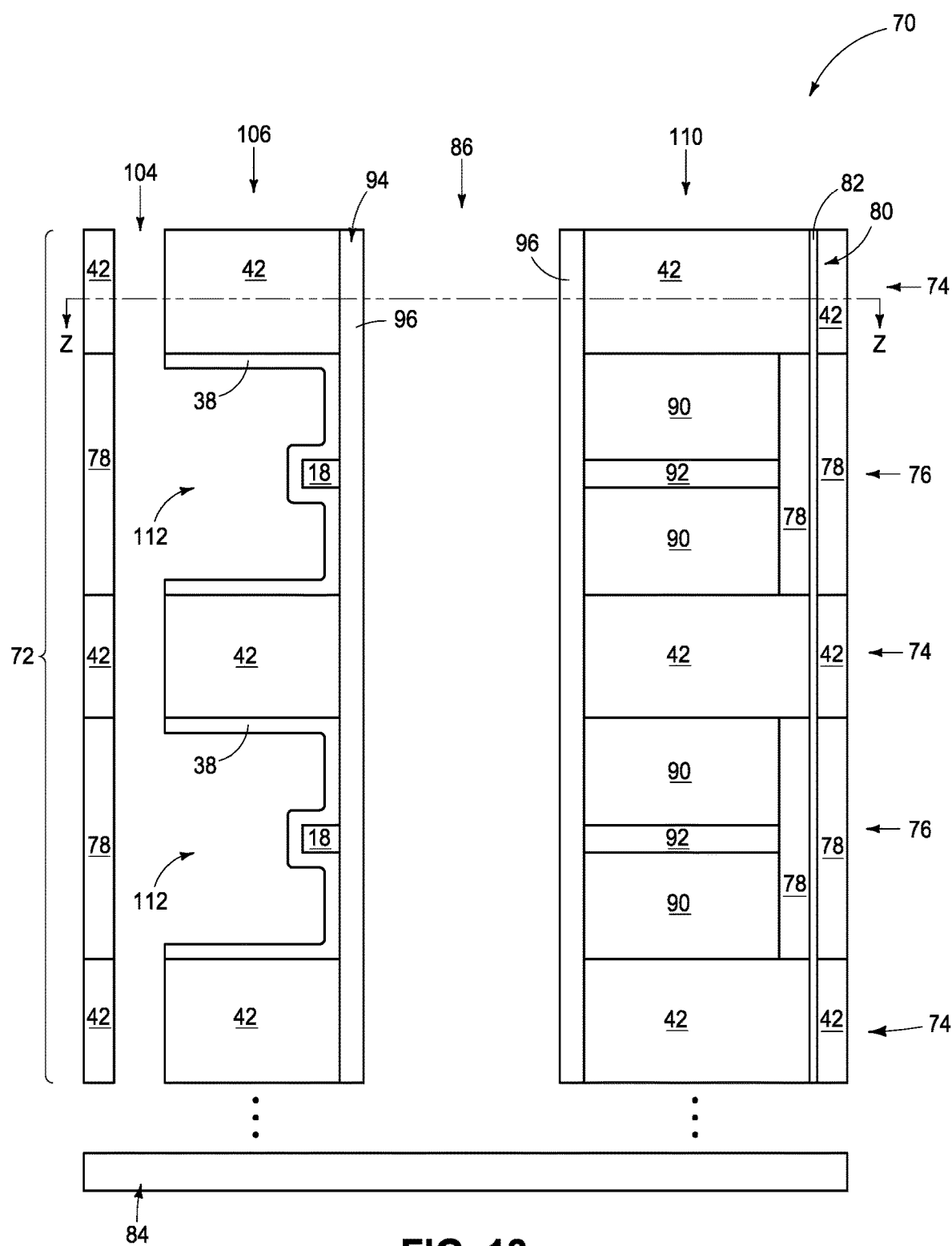
Figure 18A:
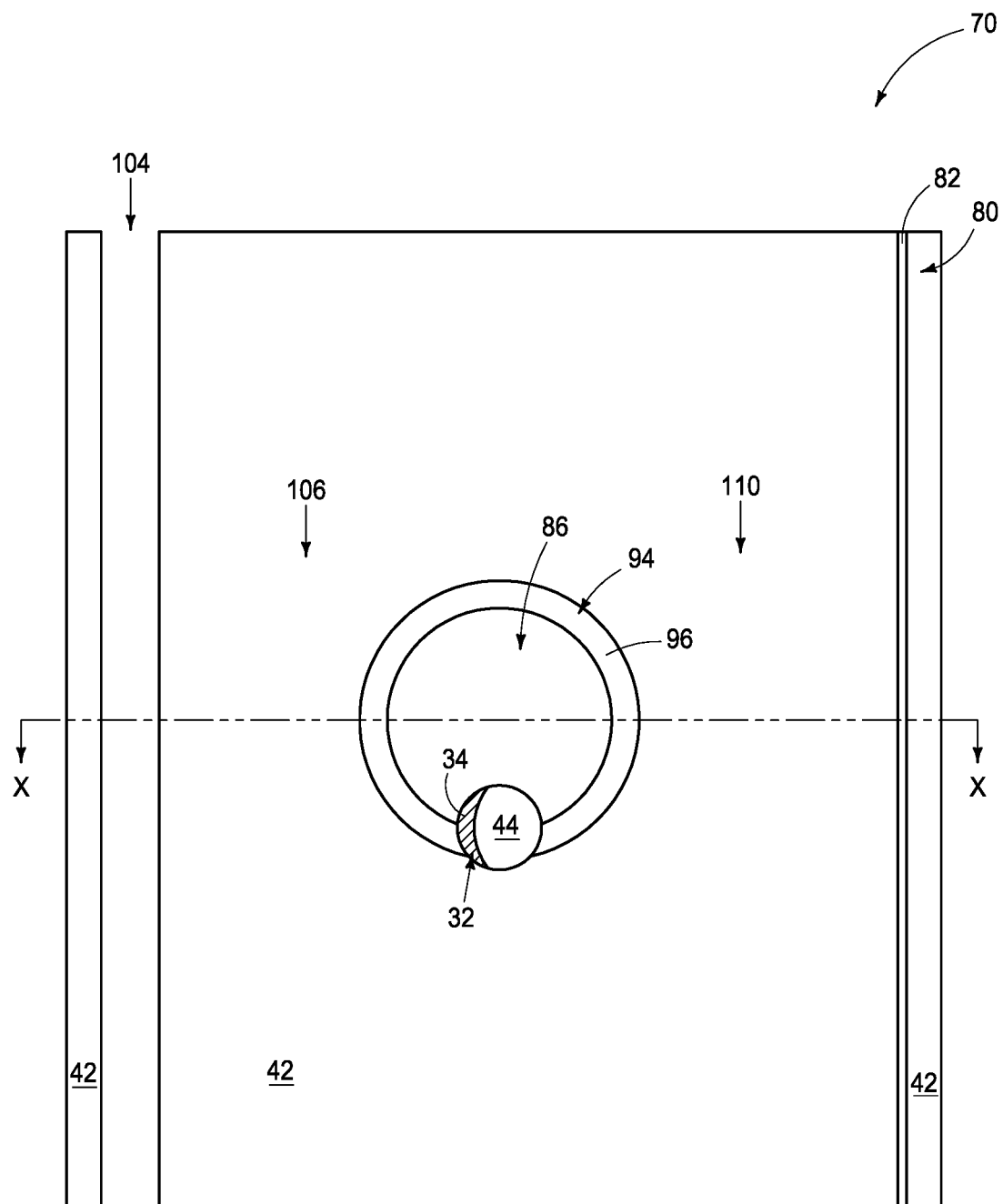

Referring to FIGS. 18 and 18A, gate dielectric material 38 is deposited within the voids 112. The gate dielectric material 38 may comprise any suitable composition(s); and in some embodiments may comprise, consist essentially of, or consist of silicon dioxide.

Figure 19A:
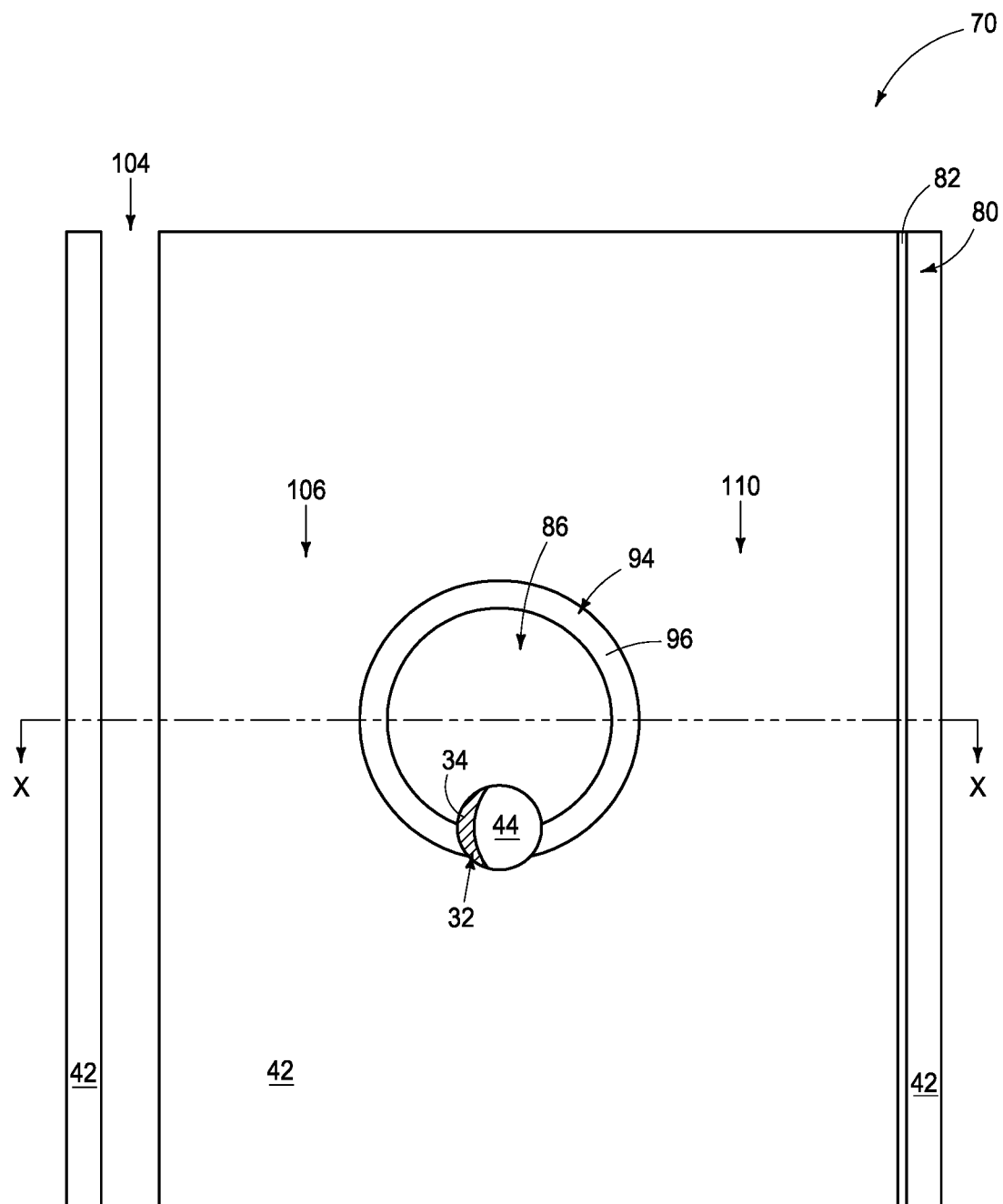

Referring to FIGS. 19 and 19A, gate material 20 and wordline material 114 are formed within the voids 112 (FIG. 18). The gate material 20 and wordline material 114 may comprise any suitable compositions, and may be the same as one another or different from one another. In some embodiments, the gate material 20 may comprise, consist essentially of, or consist of tungsten; and the wordline material 114 may comprise a conductive material to which the tungsten may be selectively etched. For instance, in some embodiments the wordline material 114 may comprise, consist essentially of, or consist of titanium nitride.

The gate material 20 forms transistor gates 16.

The gate dielectric material 38, semiconductor material 18 and gate material 20 together form transistor devices 12a and 12b along the first side 106 of the opening 86. The semiconductor material 18 comprises the channel regions 17 extending along the gates 16, and also comprises the source/drain regions 19 and 21 (shown in FIGS. 1 and 3, but not visible in FIGS. 19 and 19A).

Figure 20:
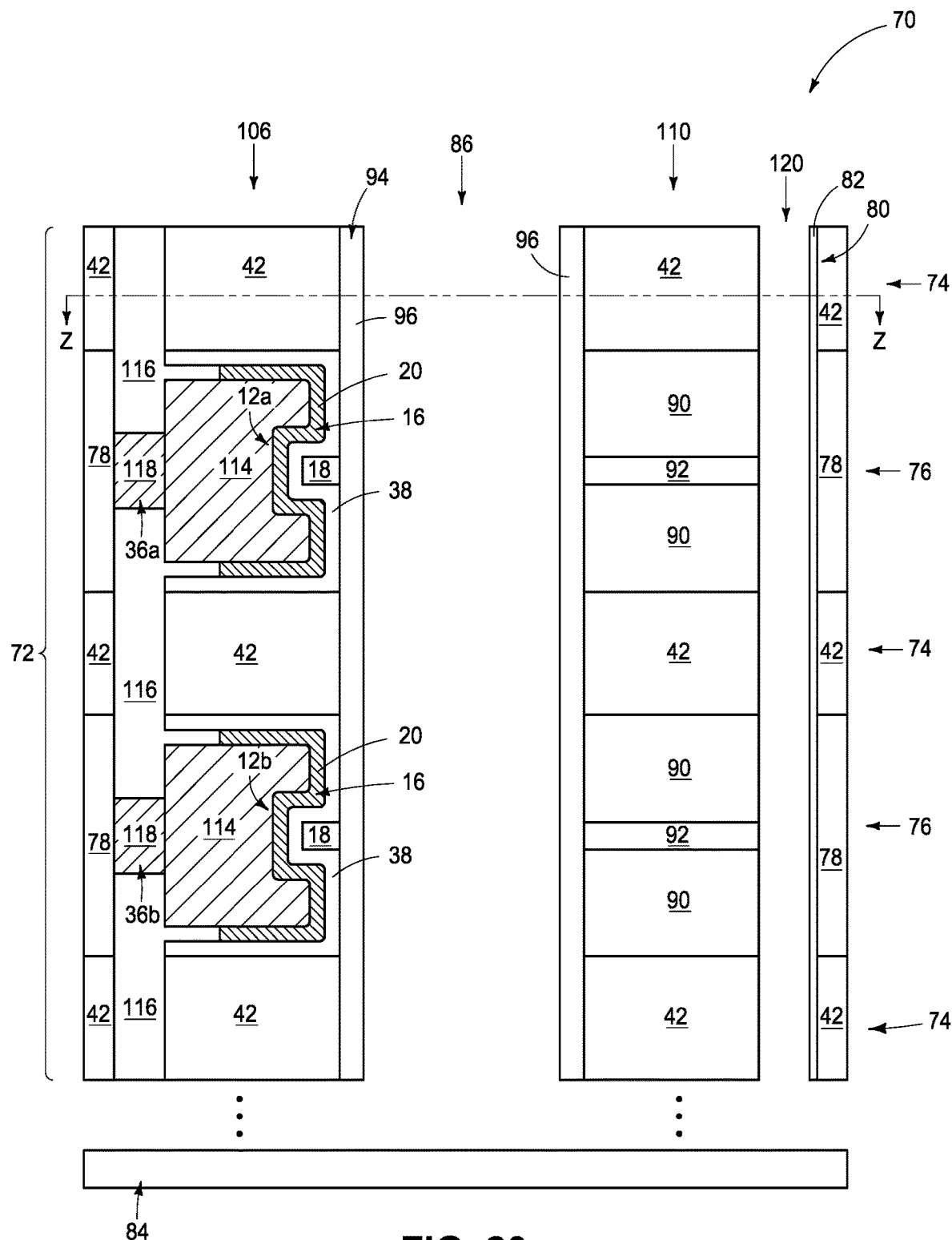
Figure 20A:
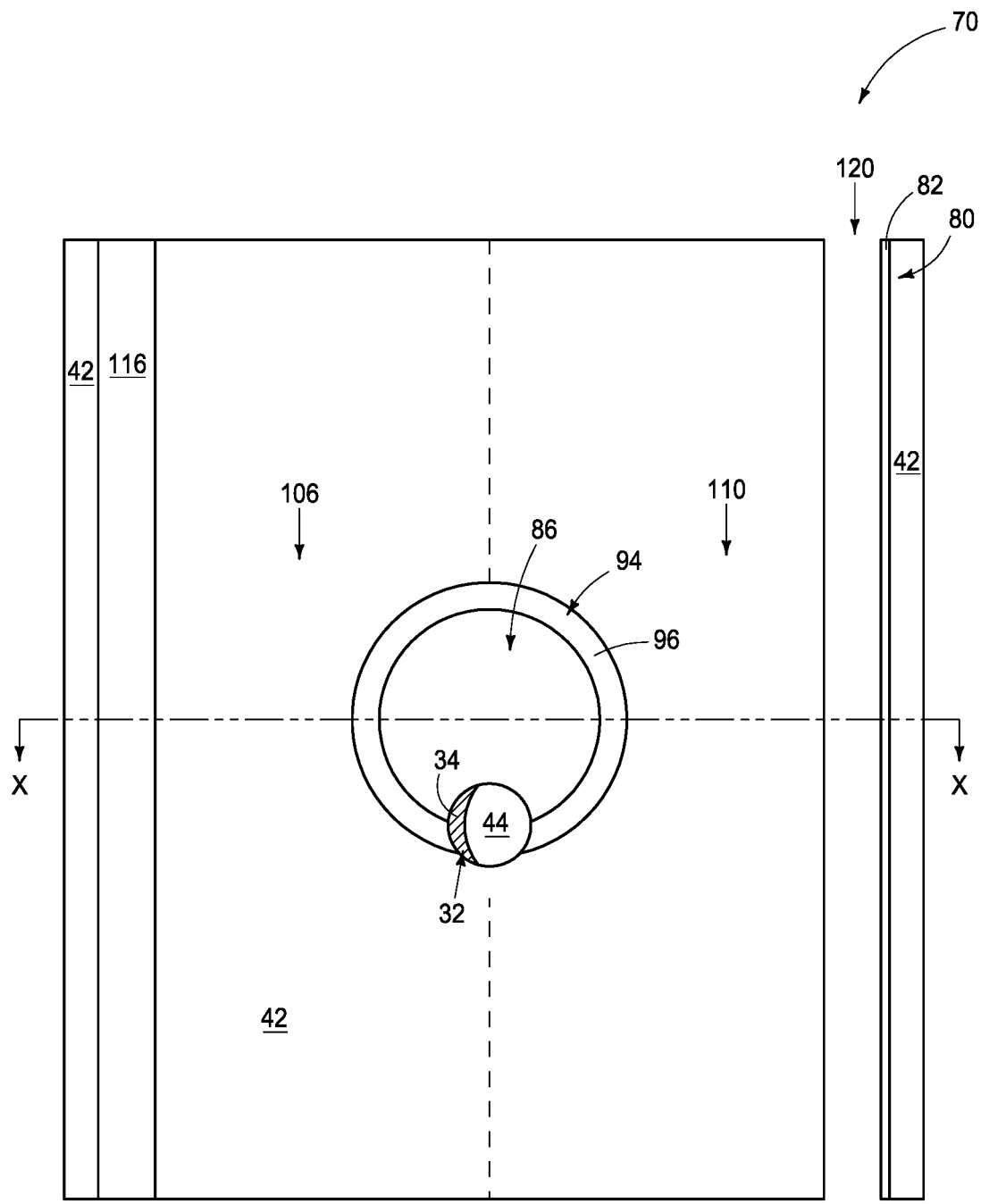

Referring to FIGS. 20 and 20A, insulative material 116 and conductive material 118 are formed within the slit 104 (FIGS. 19 and 19A). The insulative material 116 may comprise any suitable composition or combination of compositions; and in some embodiments may comprise, consist essentially of, or consist of one or more of silicon dioxide, silicon nitride, etc. The insulative material 116 may be a same composition as the insulative material 42 in some embodiments.

The conductive material 118 may comprise any suitable composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive material 118 may form wordlines 36a and 36b extending in and out of the page relative to the cross-section of FIG. 20. In some embodiments, the conductive material 118 may be a same composition as the conductive material 114, and in other embodiments the conductive materials 118 and 114 may comprise different compositions relative to one another.

A slit 120 is formed along the second side 110 of the opening 86. The slit 120 extends through the first and second levels 74 and 76, and in the illustrated embodiment is formed along a side of the panel 80.

Figure 21:
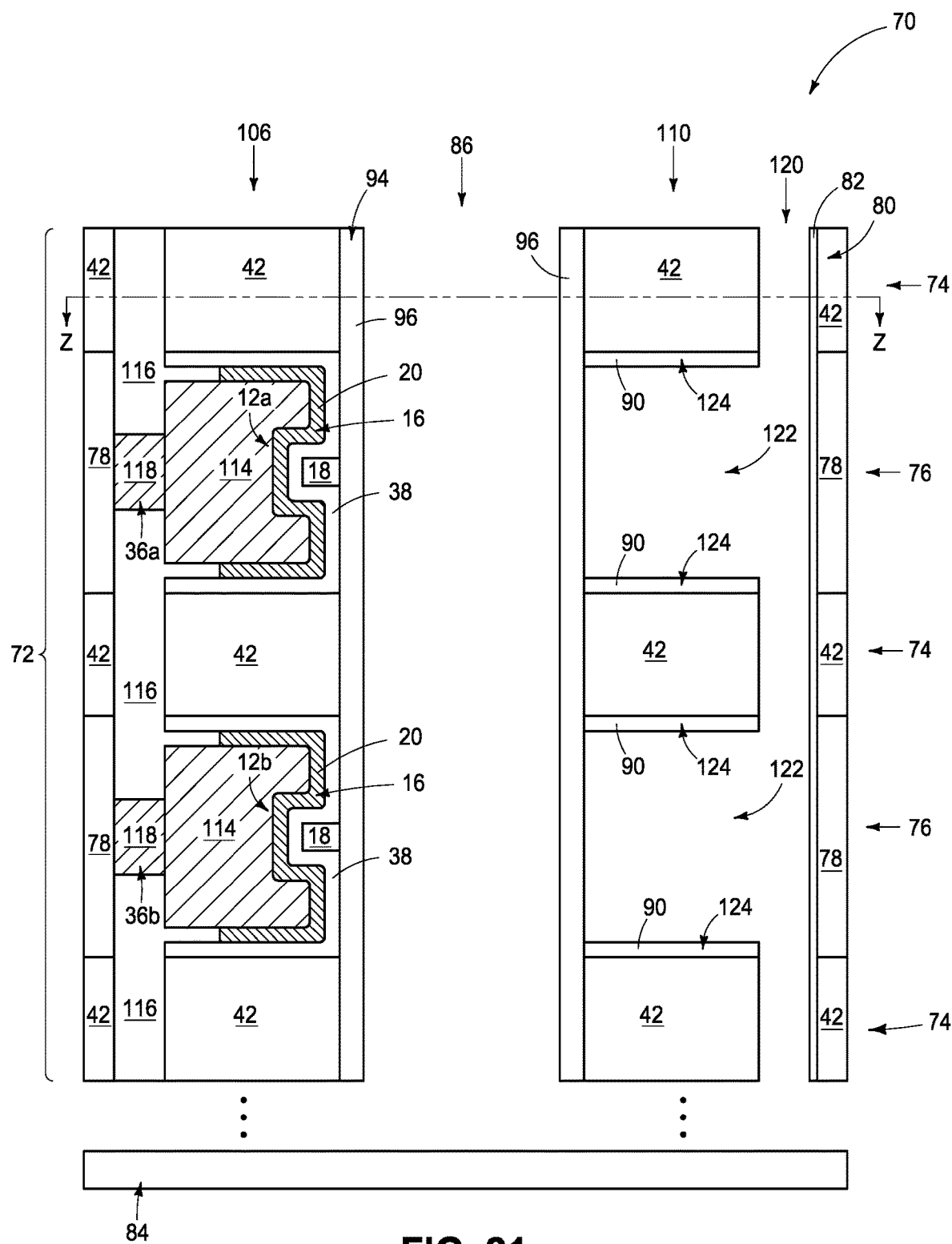
Figure 21A:
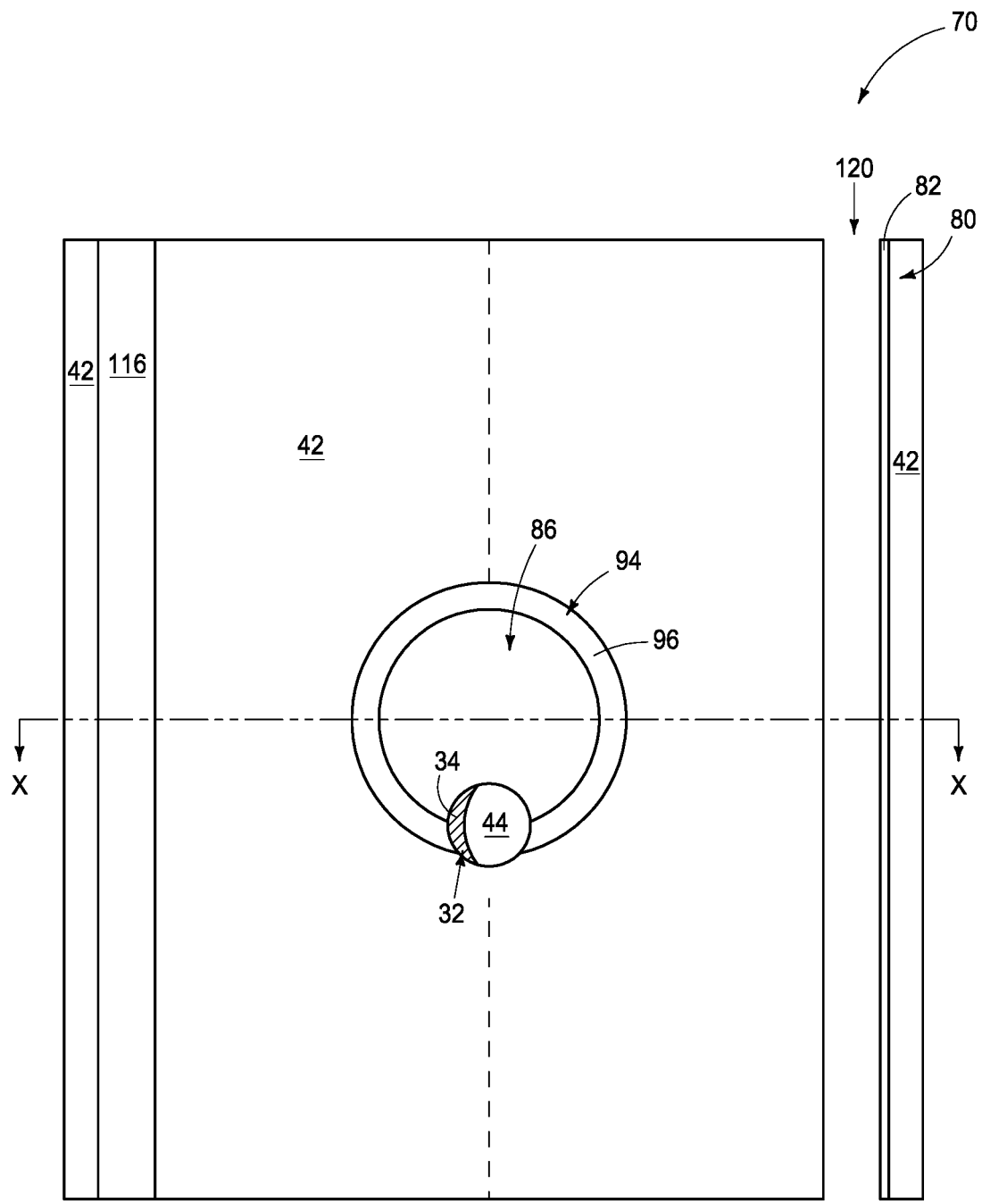

Referring to FIGS. 21 and 21A, materials 90 and 92 are removed from along the right side 110 of opening 86 to form voids 122. In the illustrated embodiment, the material 90 is thinned to leave liners 124 of the material 90 along upper and lower regions of the voids 122.

Figure 22:
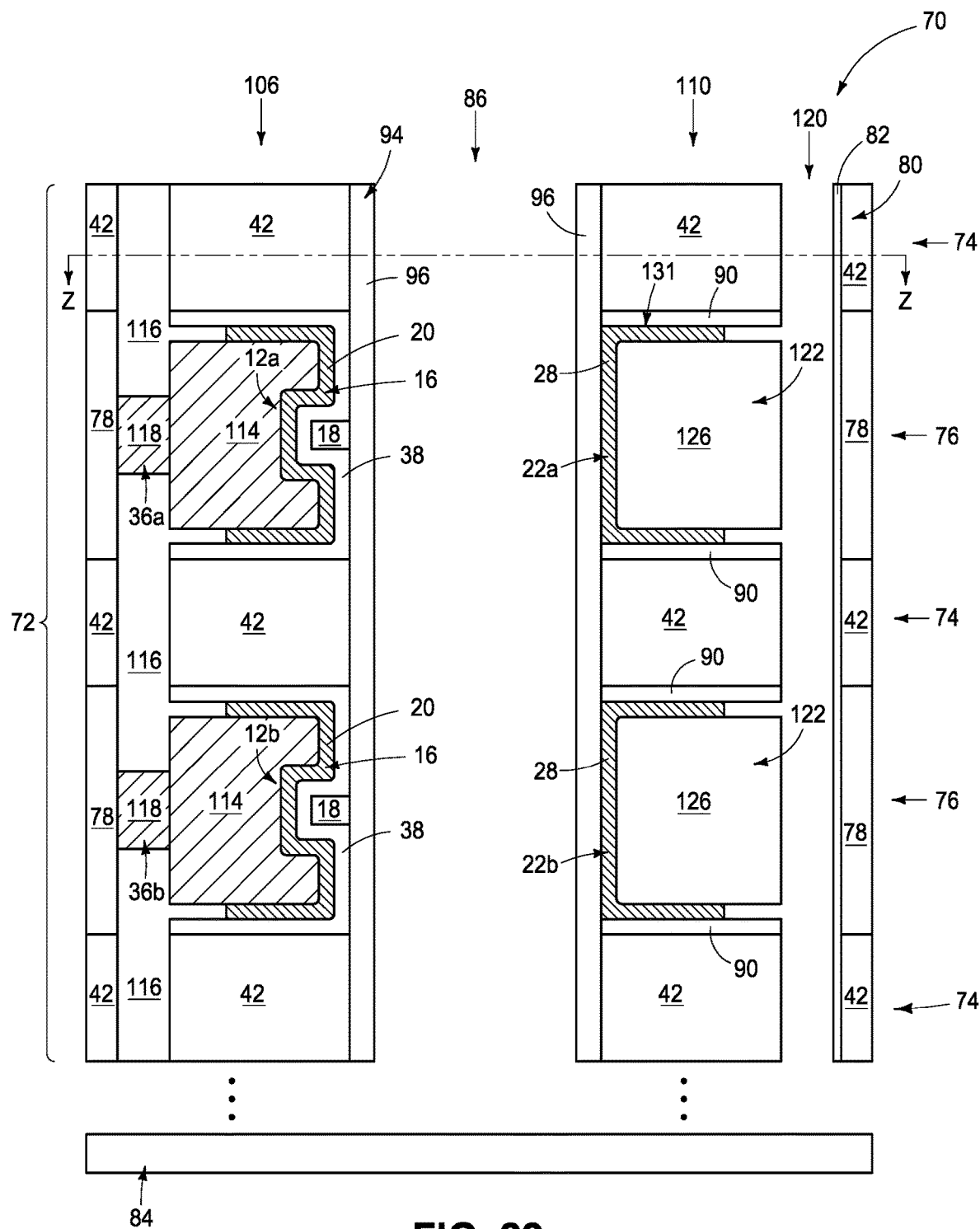
Figure 22A:
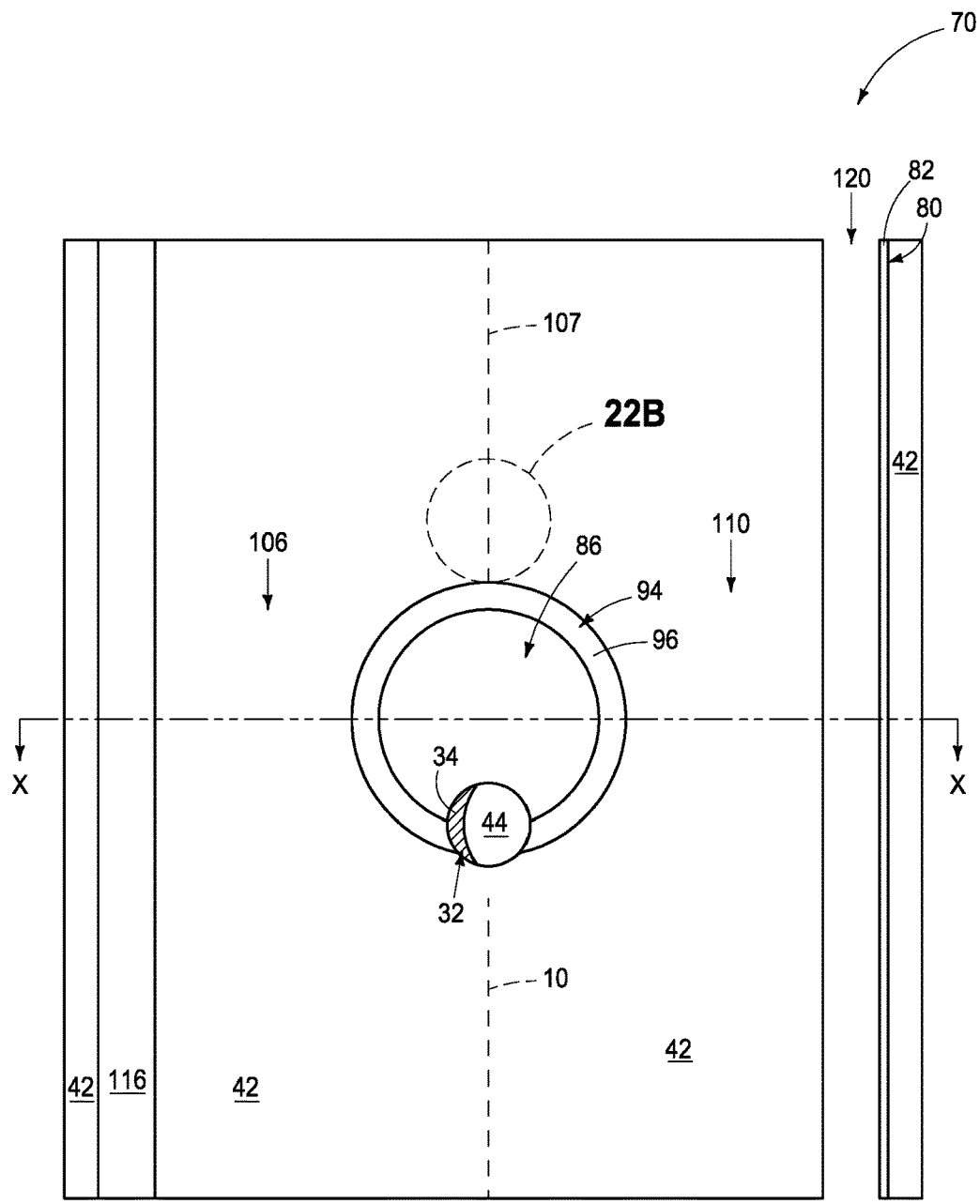
FIG. 22B is a diagrammatic cross-sectional view of an example structure that may be within a region labeled 22B in the top-down view FIG. 22A.

Referring to FIGS. 22 and 22A, the first electrode material 28 is formed within the voids 122 and patterned into the first electrodes 22a and 22b. Sacrificial material 126 is provided within the voids 122 and along the electrode material 28 to assist in the patterning of the electrode material 28 into the configuration of the first electrodes 22a and 22b. The sacrificial material 126 may comprise any suitable composition(s), and in some embodiments may comprise an oxide formed at sufficiently low temperature such that components associated with circuitry of the assembly 70 are not degraded.

Figure 22B:
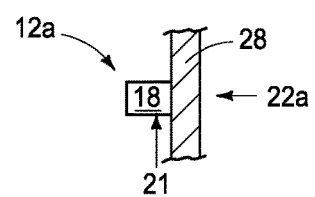

The voids 122 extend about halfway around the opening 86, and the dashed line 107 is provided to show approximate edges of the voids 122. FIG. 22B shows a region along one of the levels 76, and shows the electrode 22a directly contacting semiconductor material 18 of the transistor 12a. The region of the semiconductor material 18 which contacts the electrode 22a comprises the first source/drain region 21.

Figure 23:
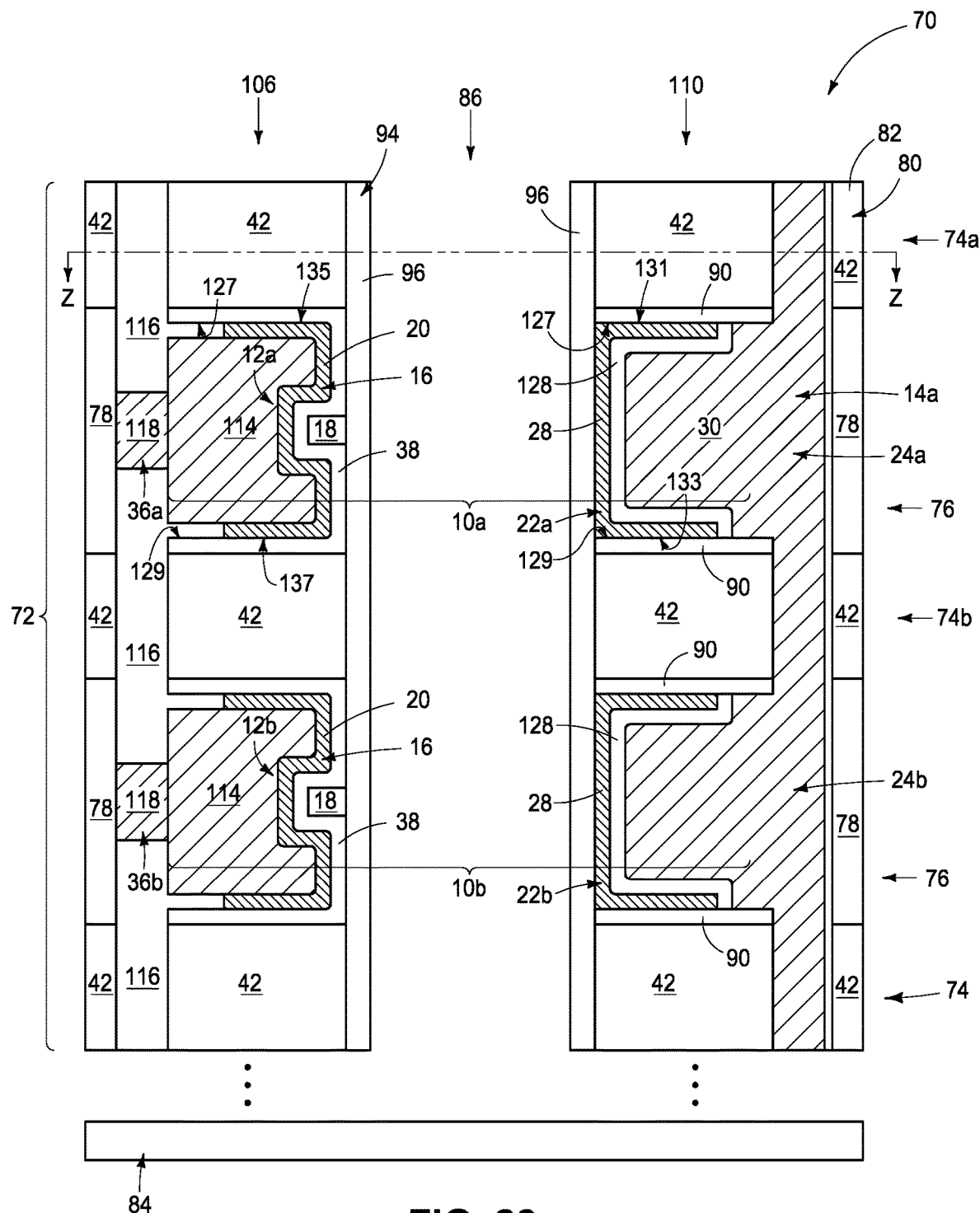
Figure 23A:
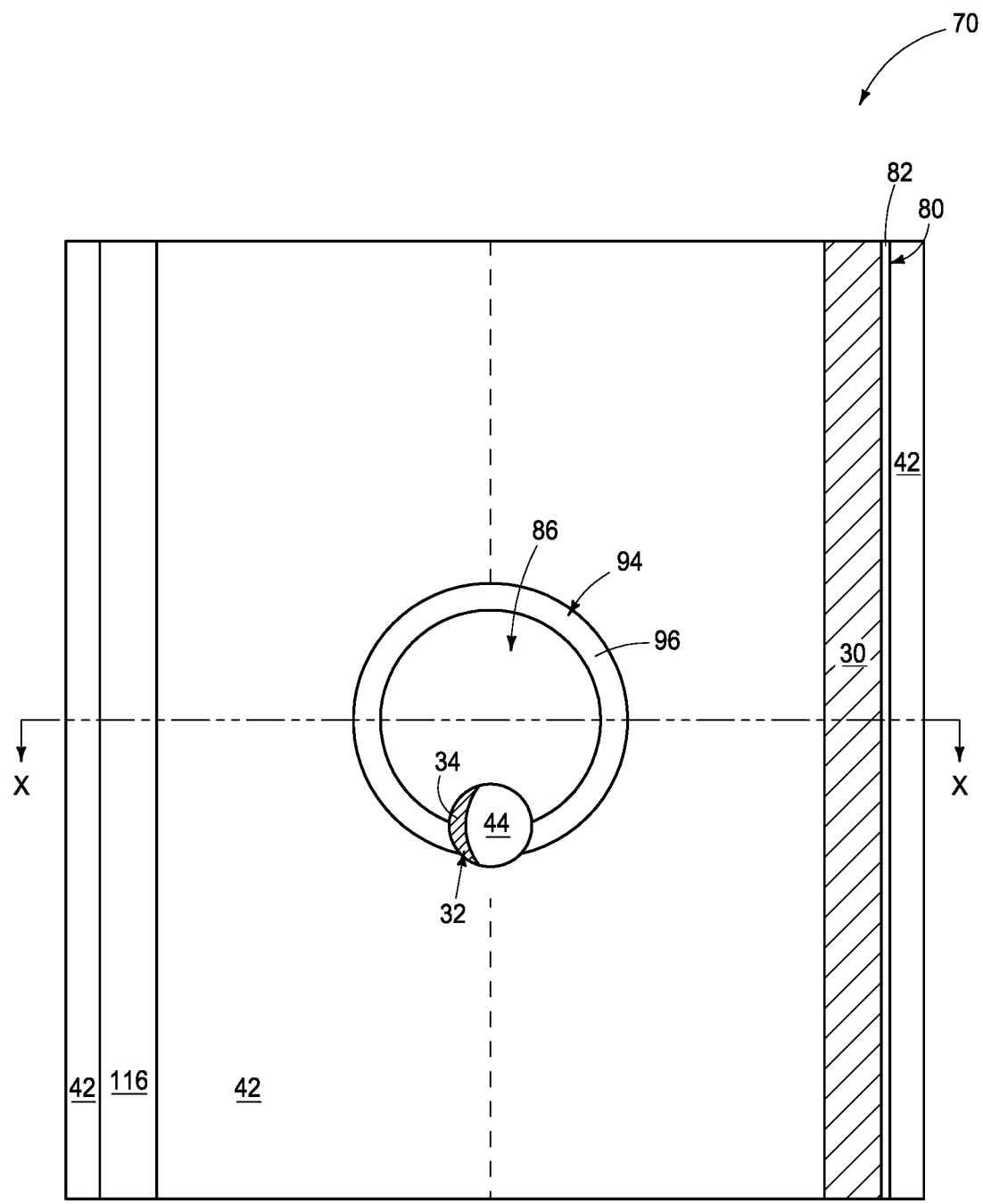

Referring to FIGS. 23 and 23A, the sacrificial material 126 (FIG. 22) is removed. Subsequently, capacitor dielectric material 128 is formed along the electrodes 22a and 22b, and then the electrode material 30 is formed along the capacitor dielectric material 128.

The capacitor dielectric material 128 may comprise any suitable composition(s); such as, for example, one or more of silicon dioxide, silicon nitride, hafnium oxide, zirconium oxide, aluminum oxide, other high-k materials (with high-k meaning a dielectric constant greater than that of silicon dioxide), etc.

The electrode material 30 forms second electrodes 24a and 24b. In the illustrated embodiment, the second electrodes 24a and 24b are electrically coupled to one another in that the conductive material 30 forms a common conductive plate extending across both of the capacitors.

The electrodes 22a and 24a, together with the dielectric material 128 therebetween, form the capacitor 14a; and the electrodes 22b and 24b, together with the dielectric material 128 therebetween, form the capacitor 14b.

The transistor 12a and the capacitor 14a together form a device 10a along one of the device levels 76, and the transistor 12b and the capacitor 14b together form a device 10b along another of the device levels 76. The devices 10a and 10b are vertically offset relative to one another (i.e., are vertically stacked).

In some embodiments, the opening 86 may be representative of a plurality of openings, as discussed above. In such embodiments, the devices 10a and 10b may be representative of a plurality of devices that may be formed relative to each of the openings. Such devices may be memory devices, and may form memory arrays; such as, for example, arrays 50 of the type described above with reference to FIGS. 6 and 7. Each of the memory devices within the memory arrays may be uniquely addressed through a combination of a wordline and a digit line, as discussed above relative to the memory arrays 50 of FIGS. 6 and 7.

In the embodiment of FIG. 23, each device (for instance, device 10a) comprises a transistor (e.g., transistor 12a) coupled with an associated capacitor (e.g., capacitor 14a). The capacitor is horizontally offset from the transistor; and both the transistor and the associated capacitor are within a single device level 76. The devices may be within a memory array 50 of the type described above with reference to FIG. 6. Wordlines (e.g., wordlines 36a, 36b) extend along the device levels 76 and are coupled with gates of the transistors 12a, 12b; and digit lines (e.g., digit line 32) extend vertically through the device levels are coupled with source/drain regions of the transistors 12a, 12b.

In some embodiments, each of the devices (e.g., devices 10a, 10b) of FIG. 23 may be considered to be between a first insulative level 74 below the device, and a second insulative level 74 above the device.

FIG. 23 shows the insulative level 74 above device 10a being labeled as a level 74a, and shows the insulative level 74 below device 10a being labeled as level 74b. The level 74a has a bottom surface 127, and the level 74b has a top surface 129. The capacitor of the device 10a (i.e., capacitor 14a) has an uppermost surface 131 and a lowermost surface 133; and the transistor of the device 10a (i.e., transistor 12a) has an uppermost surface 135 and a lowermost surface 137. The uppermost surfaces 135 and 131 of the transistor 12a and the capacitor 14a are at about a same elevational level as one another beneath the bottom surface 127 of upper insulative level 74a; and the lowermost surfaces 137 and 133 of the transistor 12a and the capacitor 14a are at about a same elevational level as one another above the upper surface 129 of the lower insulative level 74b.

In some embodiments, the capacitor 14a may have a lowermost surface 133 which is at least as far below the lowermost surface 127 of the insulative level 74a as the lowermost surface 137 of the transistor 12a, and may have an uppermost surface 131 which is at least as far above the uppermost surface 129 of the insulative level 74b has the uppermost surface 135 of the transistor 12a. If the top surface of the capacitor is no lower than the top surface of the transistor, and if the bottom surface of the capacitor is also no higher than the bottom surface of the transistor, then the transistor 12a and the capacitor 14a may be considered to be in the same planar level as one another (i.e., if the vertical dimension of the transistor is vertically coextensive with the vertical dimension of the capacitor, or vertically sandwiched between the upper and lower surfaces of the capacitor). Alternatively, the transistor 12a and the capacitor 14a may be considered to be in the same planar level as one another if the top surface of the transistor is no lower than the top surface of the capacitor, and the bottom surface of the transistor is no higher than the bottom surface of the transistor (i.e., if the vertical dimension of the capacitor is vertically coextensive with the vertical dimension of the transistor, or vertically sandwiched between the upper and lower surfaces of the transistor).

It is to be understood that the invention described herein may be applicable to numerous circuit designs, including, but not limited to memory arrays. Example circuits may include layouts which may have pillars and/or other structures associated, with, for example, transistors, isolation, gates, capacitors, etc. The example circuits may include multiple layers in one or more tier stacks. Example circuits may be one large connected structure, or may be multiple separated structures (e.g., multiple individual thin substrates).

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having a first insulative level over a semiconductor base, a second insulative level over the first insulative level, and a device between the first and second insulative levels. The device has a transistor coupled with a capacitor. The capacitor is horizontally offset relative to the transistor. The capacitor and the transistor are in the same planar level as one another.

Some embodiments include an assembly having a stack of first and second levels which alternate with one another along a vertical direction. The first levels comprise insulative material and are insulative levels. The second levels comprise integrated devices and are device levels. Each of the integrated devices includes a transistor coupled with a capacitor which is horizontally offset relative to the transistor. The capacitor and the transistor of each of the integrated devices are entirely contained within one of the device levels.

Some embodiments include an assembly having a stack of first and second levels which alternate with one another along a vertical direction. The first levels have insulative material and are insulative levels. The second levels have integrated devices and are device levels. Each of the integrated devices has a transistor coupled with an associated capacitor which is horizontally offset relative to the transistor. The transistor and the associated capacitor of each of the integrated devices are entirely contained within one of the device levels. The transistors have semiconductor channel material, and have transistor gates along the semiconductor channel material. Each of the transistors has a first source/drain region along one side of the semiconductor channel material and coupled with the associated capacitor, and has a second source/drain region on an opposing side of the semiconductor channel material from the first source/drain region. Wordlines extend horizontally along the device levels and are coupled with the transistor gates. Digit lines extend vertically through the device levels and are coupled with the second source/drain regions of the transistors.

Some embodiments include a method of forming an integrated structure. An assembly is formed to include a stack of alternating first and second levels. An opening is formed to extend through the stack. Transistor devices are formed within the second levels along a first side of the opening. Each of the transistor devices includes semiconductor material comprising a channel region between a first source/drain region and a second source/drain region. Capacitors are formed within the second levels and along a second side of the opening. Each of the capacitors includes a first electrode, a second electrode, and dielectric material between the first and second electrodes. Each of the second levels comprises one of the capacitors adjacent an associated one of the transistors. The first electrode of said one of the capacitors is directly against the first source/drain region of said associated one of the transistors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. An assembly comprising:
a stack of first and second levels which alternate with one another along a vertical direction;
the first levels comprising insulative material and being insulative levels;
the second levels comprising integrated devices and being device levels;
each of the integrated devices including a transistor coupled against a capacitor which is horizontally offset relative to the transistor;
the capacitor and the transistor of each of the integrated devices being entirely contained within one of the device levels; and
wherein the integrated devices are devoid of any line of material extending uninterrupted to cover a portion of the capacitor and a portion of the transistor.

2. The assembly of claim 1 wherein each of the transistors comprises a gate and an associated channel material.

3. The assembly of claim 2 wherein the gates of at least some of the transistors bracket the associated channel material.

4. The assembly of claim 2 wherein the gates of at least some of the transistors do not bracket the associated channel material.

5. The assembly of claim 1 wherein at least one of the integrated devices is substantially circular along a horizontal cross-section through the integrated device.

6. The assembly of claim 1 wherein at least one of the integrated devices is not substantially circular along a horizontal cross-section through the integrated device.

7. The assembly of claim 1 further comprising an insulative material covering the capacitor and transistor, the insulative material configured as a disk.

8. The assembly of claim 1 further comprising wordlines extending horizontally along the device levels.

9. The assembly of claim 1 further comprising digit lines extending vertically through the device levels.

10. An assembly, comprising:
a stack of first and second levels which alternate with one another along a vertical direction; the first levels comprising insulative material and being insulative levels; the second levels comprising integrated devices and being device levels; each of the integrated devices including a transistor coupled with an associated capacitor which is horizontally offset relative to the transistor; the transistor and the associated capacitor of each of the integrated devices being entirely contained within one of the device levels; the transistors comprising semiconductor channel material, and comprising transistor gates along the semiconductor channel material; each of the transistors comprising a first source/drain region along one side of the semiconductor channel material and coupled with the associated capacitor, and comprising a second source/drain region on an opposing side of the semiconductor channel material from said first source/drain region;
wordlines extending horizontally along the device levels and being coupled with the transistor gates; and
digit lines extending vertically through the device levels and being coupled with the second source/drain regions of the transistors.

11. The assembly of claim 10 wherein at least some of the integrated devices within one of the device levels are substantially identical to at least some of the integrated devices within at least one other of the device levels.

12. The assembly of claim 10 wherein all of the integrated devices within one of the device levels are substantially identical to all of the integrated devices within at least one other of the device levels.

13. The assembly of claim 10 wherein all of the integrated devices within one of the device levels are substantially identical to all of the integrated devices within all others of the device levels.

14. The assembly of claim 10 wherein at least some of the integrated devices within one of the device levels are not substantially identical to at least some of the integrated devices within another of the device levels.

15. The assembly of claim 14 wherein said at least some of the integrated devices within said one of the device levels differ from said at least some of the integrated devices in said other of the device levels in one or more properties of the semiconductor channel material.

16. The assembly of claim 10 wherein at least one of the digit lines is substantially circular along a horizontal cross-section through said at least one of the digit lines.

17. The assembly of claim 10 wherein at least one of the digit lines is not substantially circular along a horizontal cross-section through said at least one of the digit lines.

18. The assembly of claim 10 wherein at least one of the digit lines is substantially crescent-shaped along a horizontal cross-section through said at least one of the digit lines.

19. The assembly of claim 10 wherein the integrated devices are devoid of any line of material extending uninterrupted to cover a portion of the capacitor and a portion of the transistor.

20. The assembly of claim 10 further comprising an insulative material covering the capacitor and transistor, the insulative material configured as a disk.

* * * * *